United States Patent
Shimoda et al.

(10) Patent No.: US 9,876,067 B2
(45) Date of Patent: Jan. 23, 2018

(54) DIELECTRIC LAYER AND MANUFACTURING METHOD OF DIELECTRIC LAYER, AND SOLID-STATE ELECTRONIC DEVICE AND MANUFACTURING METHOD OF SOLID-STATE ELECTRONIC DEVICE

(71) Applicant: JAPAN SCIENCE AND TECHNOLOGY AGENCY, Saitama (JP)

(72) Inventors: Tatsuya Shimoda, Ishikawa (JP); Eisuke Tokumitsu, Ishikawa (JP); Masatoshi Onoue, Evanston, IL (US); Takaaki Miyasako, Mie (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 0 days.

(21) Appl. No.: 14/778,578

(22) PCT Filed: Mar. 12, 2014

(86) PCT No.: PCT/JP2014/056507
§ 371 (c)(1),
(2) Date: Sep. 18, 2015

(87) PCT Pub. No.: WO2014/148336
PCT Pub. Date: Sep. 25, 2014

(65) Prior Publication Data
US 2016/0284790 A1    Sep. 29, 2016

(30) Foreign Application Priority Data
Mar. 22, 2013 (JP) ................. 2013-059219

(51) Int. Cl.
H01L 21/02 (2006.01)
H01L 49/02 (2006.01)
H01L 29/51 (2006.01)

(52) U.S. Cl.
CPC ............ H01L 28/40 (2013.01); H01L 21/022 (2013.01); H01L 21/02194 (2013.01);
(Continued)

(58) Field of Classification Search
CPC ... H01L 27/1104; H01L 29/513; H01L 28/87; H01L 21/02205; H01L 21/02194; H01L 21/02269
(Continued)

(56) References Cited

U.S. PATENT DOCUMENTS

2008/0236878 A1    10/2008 Lee et al.
2009/0058954 A1*   3/2009 Arakawa .............. B41J 2/14233
                                            347/68

(Continued)

FOREIGN PATENT DOCUMENTS

CN    101276690 A    10/2008
CN    102496458 A    6/2012
(Continued)

OTHER PUBLICATIONS

Miyasako et al., "Solution-Processed Oxide Thin-Film Transistors Using La—Ta—0/Bi—Nb—O Stacked Gate Insulator.", Fall meeting, Materials Research Society, abstract, Materials Research Society, Nov. 29, 2011, Program No. S2.8.*
(Continued)

*Primary Examiner* — Tuan Nguyen

(57) ABSTRACT

The invention provides a dielectric layer having high relative permittivity with low leakage current and excellent flatness. A dielectric layer 30a according to the invention is made of multilayer oxide including a first oxide layer 31
(Continued)

made of oxide consisting of bismuth (Bi) and niobium (Nb) or oxide consisting of bismuth (Bi), zinc (Zn), and niobium (Nb) (possibly including inevitable impurities) and a second oxide layer 32 made of oxide of one type (possibly including inevitable impurities) selected from the group of oxide consisting of lanthanum (La) and tantalum (Ta), oxide consisting of lanthanum (La) and zirconium (Zr), and oxide consisting of strontium (Sr) and tantalum (Ta).

25 Claims, 20 Drawing Sheets

(52) U.S. Cl.
CPC .. *H01L 21/02205* (2013.01); *H01L 21/02269* (2013.01); *H01L 28/56* (2013.01); *H01L 28/60* (2013.01); *H01L 28/87* (2013.01); *H01L 28/91* (2013.01); *H01L 29/513* (2013.01)

(58) Field of Classification Search
USPC .................................................. 257/393, 532
See application file for complete search history.

(56) References Cited

U.S. PATENT DOCUMENTS

| 2009/0058955 | A1* | 3/2009 | Arakawa | C23C 14/0036 |
| | | | | 347/68 |
| 2010/0142116 | A1 | 6/2010 | Kim et al. | |
| 2010/0214719 | A1 | 8/2010 | Kim et al. | |
| 2013/0022839 | A1 | 1/2013 | Kijima et al. | |
| 2013/0240871 | A1* | 9/2013 | Shimoda | B41J 2/161 |
| | | | | 257/43 |

FOREIGN PATENT DOCUMENTS

| JP | H06-208806 A | | 7/1994 | | |
| JP | 2008-305844 A | | 12/2008 | | |
| JP | 2011-086819 | * | 4/2011 | ........... | H01L 21/316 |
| JP | 2011-086819 A | | 4/2011 | | |
| JP | 2011-238714 | * | 11/2011 | ............. | H01L 29/78 |
| JP | 2011-238714 A | | 11/2011 | | |
| JP | WO2012/033106 | * | 3/2012 | ............. | G11C 11/22 |
| TW | 201222827 A1 | | 6/2012 | | |
| TW | 201330033 A1 | | 7/2013 | | |
| WO | 2011/089748 A1 | | 7/2011 | | |
| WO | 2012/033106 A1 | | 3/2012 | | |
| WO | WO2012033106 | * | 3/2012 | ............. | G11C 11/22 |
| WO | 2013/069470 A1 | | 5/2013 | | |
| WO | 2013/069471 A1 | | 5/2013 | | |
| WO | 2013/073357 A1 | | 5/2013 | | |
| WO | 2013/073601 A1 | | 5/2013 | | |

OTHER PUBLICATIONS

International Search Report for PCT/JP2014/056507, Jun. 17, 2014.
Eung Soo Kim, Woong Choi, "Effect of phase transition on the microwave dielectric properties of BiNbO4", Oct. 17, 2005, Journal of the European Ceramic Society 26 (2006), 1761-1766.
Japan Patent Office, Office Action for Japanese patent application No. 2015-506721, dated Mar. 7, 2017.
T. Miyasako et al., "Solution-Processed Oxide Thin-Film Transistors Using La—Ta—O/Bi—Nb—O Stacked Gate Insulator.", Fall meeting, Materials Research Society, abstract, Materials Research Society, Nov. 29, 2011, Program No. S2.8.
State Intellectual Property Office of the People's Republic of China, Office Action for Chinese patent application No. 201480011857.1 dated Mar. 17, 2017.
Taiwan Intellectual Property Bureau Ministry of Economic Affairs, Office Action for Taiwanese patent application No. 103110410, dated May 22, 2017.
State Intellectual Property Office of the People's Republic of China, Office Action for Chinese patent application No. 201480011857.1, dated Sep. 5, 2017.

* cited by examiner

DIELECTRIC LAYER AND MANUFACTURING METHOD OF DIELECTRIC LAYER, AND SOLID-STATE ELECTRONIC DEVICE AND MANUFACTURING METHOD OF SOLID-STATE ELECTRONIC DEVICE

TECHNICAL FIELD

The present invention relates to a dielectric layer and a manufacturing method of the dielectric layer, as well as a solid-state electronic device and a manufacturing method of the solid-state electronic device.

BACKGROUND ART

There has been conventionally developed a solid-state electronic device including a ferroelectric thin film that possibly enables high speed operation. Metal oxide has been developed popularly as a dielectric material for a solid-state electronic device. Examples of dielectric ceramics that does not contain Pb and can be baked at a relatively low temperature include $BiNbO_4$. There is a report on dielectric properties of such $BiNbO_4$ formed in accordance with the solid phase epitaxy (Non-Patent Document 1). The applicant of this application has filed, although not yet being laid open, inventions relating to an oxide layer and a manufacturing method thereof (Patent Documents 1 and 2). The oxide layer (possibly including inevitable impurities) consists of bismuth (Bi) and niobium (Nb) and includes a crystal phase of a certain special crystal structure. The oxide layer enables simplification in manufacturing step and has comparatively high insulation and relative permittivity.

PRIOR ART DOCUMENTS

Patent Documents

Patent Document 1: Japanese Patent Application No. 2011-245915
Patent Document 2: Japanese Patent Application No. 2011-245916

Non-patent Document

Non-Patent Document 1: Effect of phase transition on the microwave dielectric properties of $BiNbO_4$, Eung Soo Kim, Woong Choi, Journal of the European Ceramic Society 26 (2006) 1761-1766

SUMMARY OF THE INVENTION

Problems to be Solved by the Invention

However, a dielectric substance containing $BiNbO_4$ and formed in accordance with a conventional technique of the solid phase epitaxy does not have high relative permittivity. Dielectric properties of the dielectric substance need to be further improved in order to apply the dielectric substance to a multilayer capacitor. The industry also strongly requires development of a dielectric substance exerting high performance, which is applicable to the multilayer capacitor as well as to various solid-state electronic devices (e.g. a semiconductor device or a microscopic electromechanical system).

The conventional technique typically includes the vacuum process, a process according to the photolithography technique, or the like, which requires a relatively long time period and/or expensive equipment. These processes lead to quite low utilization ratios of raw materials and manufacturing energy. When adopting the manufacturing method described above, manufacture of a multilayer capacitor requires many steps and a long time period, which is not preferred from the industrial and mass productivity perspectives. The conventional technique also causes the problem that increase in area is relatively difficult to achieve.

The inventions so far filed by the applicant of this application propose several solutions to the above technical problems of the conventional technique. Further research and development are still needed for optimization of a dielectric substance and an electrode adopted in the multilayer capacitor or the other various solid-state electronic devices.

Solutions to the Problems

The present invention solves at least one of the above problems, to achieve improvement in performance of a multilayer capacitor at least including a dielectric layer made of oxide or the other various solid-state electronic devices mentioned above, or simplification and energy saving in a manufacturing process of the multilayer capacitor or the other various solid-state electronic devices mentioned above. The present invention thus contributes remarkably to provision of the multilayer capacitor or the other various solid-state electronic devices mentioned above that are excellent from the industrial and mass productivity perspectives.

The inventors of this application have gone through intensive researches and analysis on selection and combination of oxide out of many options, which is included in the multilayer capacitor or the other various solid-state electronic devices and appropriately exerts the function of a dielectric substance and/or an electrode layer. Even if oxide has high performance as a dielectric substance, it is interesting that the oxide interposed between electrode layers may not at all exert the high performance as the dielectric substance or may hardly function as a dielectric substance in some cases.

However, the inventors of this application have found, through many trials and tests as well as detailed analysis, that a dielectric substance included in the multilayer capacitor or the other various solid-state electronic devices and formed into a special multilayer structure in combination with certain specific oxide layers can appropriately exert the function of a dielectric layer. The inventors have also found that adoption of the special structure achieves effective exertion of performance of the dielectric layer according to a different aspect, when the dielectric layer is disposed to be interposed between electrode layers, in other words, to have a sandwich structure. The inventors of this application have further found that provision of at least one of such a dielectric layer can achieve improvement in performance of the multilayer capacitor or the other various solid-state electronic devices.

The inventors have also found that adoption of a specific oxide layer as the electrode layer achieves formation of the electrode layer and the dielectric layer each made of an oxide layer. The inventors have also found that the specific dielectric layer and/or electrode layer can achieve further simplification in manufacturing step. The present invention has been devised in view of these points.

A dielectric layer according to the present invention is made of multilayer oxide including a first oxide layer 31 made of oxide consisting of bismuth (Bi) and niobium (Nb) or oxide consisting of bismuth (Bi), zinc (Zn), and niobium (Nb) (possibly including inevitable impurities) and a second oxide layer 32 made of oxide of one type (possibly including inevitable impurities) selected from the group of oxide consisting of lanthanum (La) and tantalum (Ta), oxide consisting of lanthanum (La) and zirconium (Zr), and oxide consisting of strontium (Sr) and tantalum (Ta).

The dielectric layer is made of the multilayer oxide including the stacked specific first and second oxide layers. The inventors have found, through researches, that the first oxide has relatively high permittivity with a large leakage current value and low surface flatness. In contrast, the second oxide has been found to have relatively low permittivity with a quite small leakage current value and excellent surface flatness. The inventors have interestingly found, through examinations and analysis of the multilayer oxide including the stacked first and second oxide layers, that the multilayer oxide is expected to exert the advantages of the second oxide for the leakage current value and the flatness and exert the advantages of the first oxide for the permittivity.

A solid-state electronic device according to the present invention includes a dielectric layer made of multilayer oxide including a first oxide layer 31 made of oxide consisting of bismuth (Bi) and niobium (Nb) or oxide consisting of bismuth (Bi), zinc (Zn), and niobium (Nb) (possibly including inevitable impurities) and a second oxide layer 32 made of oxide of one type (possibly including inevitable impurities) selected from the group of oxide consisting of lanthanum (La) and tantalum (Ta), oxide consisting of lanthanum (La) and zirconium (Zr), and oxide consisting of strontium (Sr) and tantalum (Ta).

The solid-state electronic device includes the dielectric layer that is made of the multilayer oxide including the stacked specific first and second oxide layers. The inventors have found, through researches, that the first oxide has relatively high permittivity with a large leakage current value and low surface flatness. In contrast, the second oxide has been found to have relatively low permittivity with a quite small leakage current value and excellent surface flatness. The inventors have interestingly found, through examinations and analysis of the multilayer oxide including the stacked first and second oxide layers, that the multilayer oxide is expected to exert the advantages of the second oxide for the leakage current value and the flatness and exert the advantages of the first oxide for the permittivity.

The solid-state electronic device according to a different preferred aspect partially has a structure including a single electrode layer and the single dielectric layer described above being stacked.

In the solid-state electronic device according to a different preferred aspect, the electrode layers disposed to at least partially interpose the dielectric layer are made of electrode layer oxide of one type selected from the group of oxide consisting of lanthanum (La) and nickel (Ni), oxide consisting of antimony (Sb) and tin (Sn), and oxide consisting of indium (In) and tin (Sn) (possibly including inevitable impurities). This aspect embodies the solid-state electronic device (preferably in particular a multilayer capacitor) of high performance, including the dielectric layer and the electrode layers each made of oxide.

A manufacturing method of a dielectric layer according to the present invention includes (1) a first oxide layer forming step and (2) a second oxide layer forming step described below.

(1) The first oxide layer forming step of heating in an atmosphere containing oxygen a first precursor layer obtained from a first precursor solution as a start material, of a precursor solution including a precursor containing bismuth (Bi) and a precursor containing niobium (Nb) as solutes or a precursor solution including a precursor containing bismuth (Bi), a precursor containing zinc (Zn), and a precursor containing niobium (Nb) as solutes, and forming a first oxide layer (possibly including inevitable impurities) consisting of the bismuth (Bi) and the niobium (Nb), or consisting of the bismuth (Bi), the zinc (Zn), and the niobium (Nb).

(2) The second oxide layer forming step of heating in an atmosphere containing oxygen a second precursor layer obtained from a second precursor solution as a start material, selected from the group of a precursor solution including a precursor containing lanthanum (La) and a precursor containing tantalum (Ta) as solutes, a precursor solution including a precursor containing lanthanum (La) and a precursor containing zirconium (Zr) as solutes, and a precursor solution including a precursor containing strontium (Sr) and a precursor containing tantalum (Ta) as solutes, and forming above or below the first oxide layer a second oxide layer (possibly including inevitable impurities) consisting of the lanthanum (La) and the tantalum (Ta), consisting of the lanthanum (La) and the zirconium (Zr), or consisting of the strontium (Sr) and the tantalum (Ta).

This manufacturing method is not limited in terms of including, between the above steps, any step not relevant to the gist of the present invention, such as shifting the substrate or inspection.

According to the manufacturing method of the dielectric layer, the first oxide and the second oxide can be formed through a relatively simple process not in accordance with the photolithography technique (but in accordance with the ink jet technique, the screen printing technique, the intaglio/relief printing technique, the nanoimprinting technique, or the like). The manufacturing method also facilitates increase in area. The manufacturing method of the dielectric layer is thus excellent from the industrial and mass productivity perspectives.

A manufacturing method of a solid-state electronic device according to the present invention includes (1) the first oxide layer forming step and (2) the second oxide layer forming step described below.

(1) The first oxide layer forming step of heating in an atmosphere containing oxygen a first precursor layer obtained from a first precursor solution as a start material, of a precursor solution including a precursor containing bismuth (Bi) and a precursor containing niobium (Nb) as solutes or a precursor solution including a precursor containing bismuth (Bi), a precursor containing zinc (Zn), and a precursor containing niobium (Nb) as solutes, and forming a first oxide layer (possibly including inevitable impurities) consisting of the bismuth (Bi) and the niobium (Nb), or consisting of the bismuth (Bi), the zinc (Zn), and the niobium (Nb).

(2) The second oxide layer forming step of heating in an atmosphere containing oxygen a second precursor layer obtained from a second precursor solution as a start material, selected from the group of a precursor solution including a precursor containing lanthanum (La) and a precursor containing tantalum (Ta) as solutes, a precursor solution including a precursor containing lanthanum (La) and a precursor containing zirconium (Zr) as solutes, and a precursor solution including a precursor containing strontium (Sr) and a precursor containing tantalum (Ta) as solutes, and forming above or below the first oxide layer a second oxide layer (possibly including inevitable impurities) consisting of the lanthanum (La) and the tantalum (Ta), consisting of the lanthanum (La) and the zirconium (Zr), or consisting of the strontium (Sr) and the tantalum (Ta).

This manufacturing method is not limited in terms of including, between the above steps, any step not relevant to the gist of the present invention, such as shifting the substrate or inspection.

According to the manufacturing method of the solid-state electronic device, the first oxide and the second oxide can be formed through a relatively simple process not in accordance with the photolithography technique (but in accordance with the ink jet technique, the screen printing technique, the intaglio/relief printing technique, the nanoimprinting technique, or the like). The manufacturing method also facilitates increase in area. The manufacturing method of the solid-state electronic device is thus excellent from the industrial and mass productivity perspectives.

In the manufacturing method of the solid-state electronic device according to a different aspect of the present invention, each of (1) the first oxide layer forming step and (2) the second oxide layer forming step are executed between a first electrode layer forming step of forming a first electrode layer and a second electrode layer forming step of forming a second electrode layer, the first oxide layer and the second oxide layer being interposed between the first electrode layer and the second electrode layer. Furthermore, the first electrode layer forming step, (1) the first oxide layer forming step, (2) the second oxide layer forming step, and the second electrode layer forming step can be each executed once.

In the manufacturing method of the solid-state electronic device according to a different preferred aspect, at least one of the first electrode layer forming step and the second electrode layer forming step includes heating in an atmosphere containing oxygen an electrode layer precursor layer obtained from an electrode layer precursor solution as a start material, of a precursor solution including a precursor containing lanthanum (La) and a precursor containing nickel (Ni) as solutes, a precursor solution including a precursor containing antimony (Sb) and a precursor containing tin (Sn) as solutes, or a precursor solution including a precursor containing indium (In) and a precursor containing tin (Sn) as solutes, and forming electrode layer oxide (possibly including inevitable impurities) as oxide consisting of the lanthanum (La) and the nickel (Ni), oxide consisting of the antimony (Sb) and the tin (Sn), or oxide consisting of the indium (In) and the tin (Sn). This aspect embodies the solid-state electronic device (preferably in particular a multilayer capacitor) of high performance, including the first and/or second electrode layers as well as the dielectric layer each made of oxide.

In the manufacturing method of the solid-state electronic device according to another different preferred aspect, at least one of the first oxide layer forming step and the second oxide layer forming step further includes an imprinting step of imprinting a first precursor layer obtained from the first precursor solution as a start material of a second precursor layer obtained from the second precursor solution as a start material, being heated at a temperature in the range from 80° C. or more to 300° C. or less in an atmosphere containing oxygen, before forming the first oxide or the second oxide, and forming an imprinted structure on the first precursor layer or the second precursor layer. There is thus no need to include a process requiring a relatively long time period and/or expensive equipment, such as the vacuum process, a process in accordance with the photolithography technique, or the ultraviolet irradiation process. Moreover, the first and second oxide layers are formed through heat treatment at a relatively low temperature with no need for any of the above processes. The manufacturing method is thus excellent from the industrial and mass productivity perspectives.

In the manufacturing method of the solid-state electronic device according to still another different preferred aspect, at least one of the first electrode layer forming step and the second electrode layer forming step further includes an imprinting step of imprinting the electrode layer precursor layer obtained from the electrode layer precursor solution as a start material heated at a temperature in the range from 80° C. or more to 300° C. or less in an atmosphere containing oxygen, before forming the electrode layer oxide, and forming an imprinted structure on the electrode layer precursor layer. There is thus no need to include a process requiring a relatively long time period and/or expensive equipment, such as the vacuum process, a process in accordance with the photolithography technique, or the ultraviolet irradiation process. Moreover, the oxide for the first and/or second electrode is formed through heat treatment at a relatively low temperature with no need for any of the above processes. The manufacturing method is thus excellent from the industrial and mass productivity perspectives. In this application, each of the "electrode layer precursor solution", the "electrode layer precursor layer", and the "electrode layer oxide" can be applied to or correspond to the eventually formed first or second electrode.

In this application, "imprinting" is also called "nanoimprinting".

Effects of the Invention

The present invention embodies a solid-state electronic device including a dielectric layer that has suppressed leakage current and excellent flatness. The present invention also provides a manufacturing method of a solid-state electronic device that includes first and second oxide layers formed through relatively simple processes and is thus excellent from the industrial and mass productivity perspectives.

DESCRIPTION OF REFERENCE SIGNS

Figure 1:
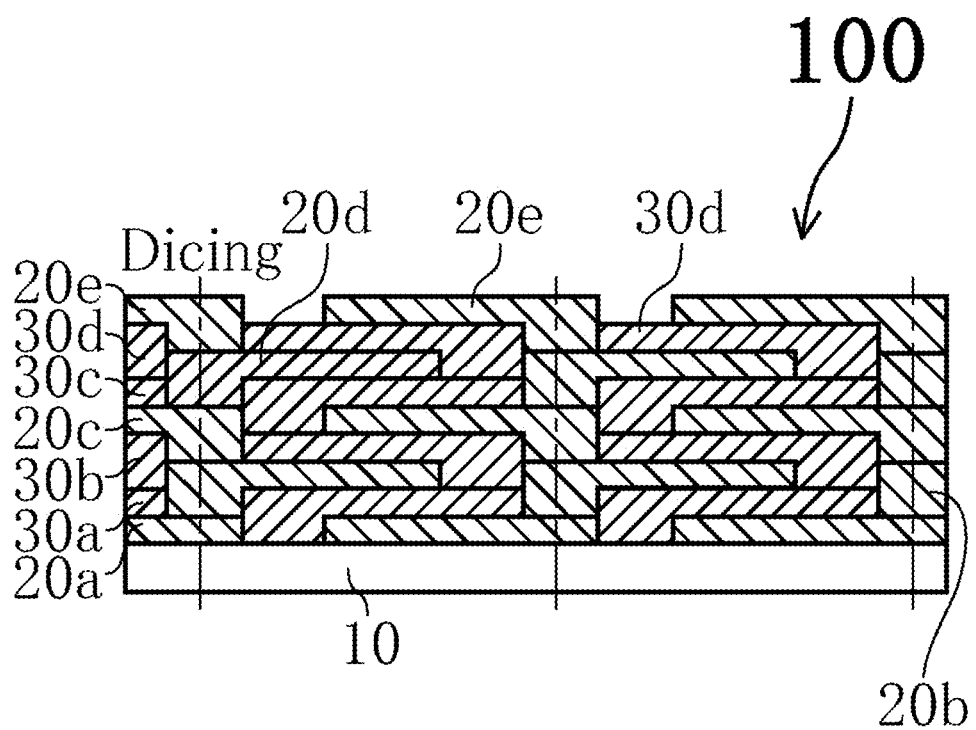
FIG. 1 is a sectional schematic view of a structure of a multilayer capacitor according to a first embodiment of the present invention.

10 Substrate
20a, 20b, 20c, 20d, 20e Electrode layer
21a, 21b Electrode layer precursor layer
30a, 30b, 30c, 30d Dielectric layer
31 First oxide layer
31a Second precursor layer
32 Second oxide layer
32a Second precursor layer
33a, 33b Dielectric layer precursor layer
100, 200 Multilayer capacitor
M1 Electrode layer mold
M2 Dielectric layer mold

EMBODIMENTS OF THE INVENTION

A multilayer capacitor 100 exemplifying a solid-state electronic device according to each of the embodiments of the present invention and a manufacturing method thereof will now be described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the respective drawings.

First Embodiment

Structure of Multilayer Capacitor 100

FIG. 1 is a sectional schematic view of a structure of the multilayer capacitor 100 exemplifying a solid-state electronic device according to the present embodiment. As shown in FIG. 1, the multilayer capacitor 100 according to the present embodiment partially has a structure in which totally five electrode layers and totally four dielectric layers are stacked alternately. In a portion where the electrode layers and the dielectric layers are not stacked alternately, the electrode layers are provided such that a lower one of the electrode layers (e.g. a firstly stacked electrode layer 20a) and an upper one of the electrode layers (e.g. a fifthly stacked electrode layer 20e) are electrically connected to each other. Vertical dashed lines in FIG. 1 indicate separated positions by dicing after formation of the respective layers. Materials and compositions of electrode layers 20a, 20b, 20c, 20d, and 20e as well as of dielectric layers 30a, 30b, 30c, and 30d will be disclosed later in the description of a manufacturing method of the multilayer capacitor 100 according to the present embodiment.

Manufacturing Steps of Multilayer Capacitor 100

FIGS. 2 to 12 are sectional schematic views each showing a process in the manufacturing method. FIGS. 2, 3, 5, and 7 each show a partially extracted structure of the multilayer capacitor 100 shown in FIG. 1, for easier description. Temperatures indicated in this application are preset temperatures of a heater.

(1) Formation of Firstly Stacked Electrode Layer 20a

According to the present embodiment, initially formed on an SiO₂/Si substrate (i.e. a silicon substrate provided thereon with a silicon oxide film; hereinafter, also simply referred to as the "substrate") 10 in accordance with the known spin coating technique is an electrode layer precursor layer 21a obtained from a precursor solution as a start material including both a precursor containing lanthanum (La) and a precursor containing nickel (Ni) as solutes (called an electrode layer precursor solution; hereinafter, this applies to a solution of each of firstly to fifthly stacked electrode layer precursors). The electrode layer precursor layer 21a is then heated at a temperature in the range from 150° C. or more to 250° C. or less for about five minutes so as to be preliminarily baked. This preliminary baking is performed in the oxygen atmosphere or in the atmosphere (hereinafter, also collectively called an "atmosphere containing oxygen").

Figure 2:
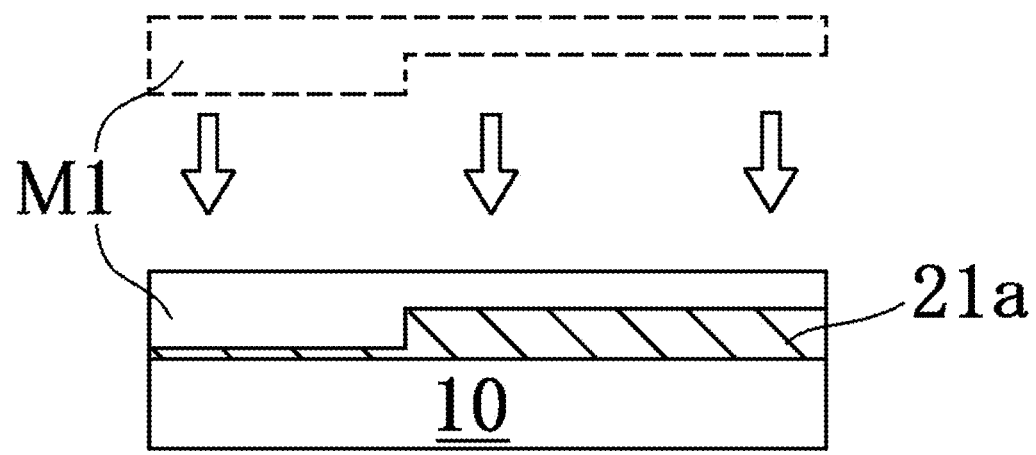
FIG. 2 is a sectional schematic view of a process in a manufacturing method of the multilayer capacitor according to the first embodiment of the present invention.

This preliminary baking can sufficiently evaporate a solvent in the electrode layer precursor layer 21a and can cause a preferred gel state for exerting properties that enable future plastic deformation (possibly a state where organic chains remain before pyrolysis). The preliminary baking is performed preferably at a temperature in the range from 80° C. or more to 250° C. or less in order to reliably cause the above phenomena. As shown in FIG. 2, imprinting is subsequently performed to pattern the firstly stacked electrode layer 20a, using an electrode layer mold M1 with a pressure of 1 MPa or more and 20 MPa or less (typically 5 MPa) while the electrode layer precursor layer 21a is heated at 200° C. Formed by this imprinting using the electrode layer mold M1 according to the present embodiment is the firstly stacked electrode layer precursor layer 21a including a thick layer portion of about 100 nm to 300 nm thick and a thin layer portion of about 10 nm to 100 nm thick.

The inventors have found, through researches, that heating the firstly stacked electrode layer precursor layer 21a as well as the secondly to fifthly stacked electrode layer precursor layers to be described later at a temperature in the range from 80° C. or more to 300° C. or less during the imprinting achieves improvement in plastic deformability of the respective electrode layer precursor layers and sufficient removal of a main solvent. In view of the above, according to a preferred aspect, each of the electrode layer precursor layers mentioned above is heated at a temperature in the range from 80° C. or more to 300° C. or less for the imprinting. If the heating temperature for the imprinting is less than 80° C., the temperature of the respective electrode layer precursor layers decreases to deteriorate plastic deformability of the respective precursor layers. This leads to lower moldability during formation of an imprinted structure, or lower reliability or stability after the formation. In contrast, if the heating temperature for the imprinting exceeds 300° C., decomposition of organic chains (oxidative pyrolysis) exerting plastic deformability proceeds and the plastic deformability thus deteriorates. In view of the above, according to a more preferred aspect, each of the electrode layer precursor layers mentioned above is heated at a temperature in the range from 100° C. or more to 250° C. or less for the imprinting.

Figure 3:
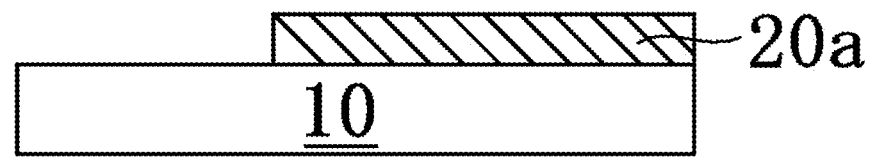
FIG. 3 is a sectional schematic view of a process in the manufacturing method of the multilayer capacitor according to the first embodiment of the present invention.

As shown in FIG. 3, the firstly stacked electrode layer precursor layer 21a is then entirely etched so that the firstly stacked electrode layer precursor layer 21a is removed in the regions other than a region corresponding to the firstly stacked electrode layer (the step of entirely etching the firstly stacked electrode layer precursor layer 21a). The etching step in the present embodiment is executed in accordance with the wet etching technique without adopting the vacuum process. The etching can be possibly performed using plasma, in accordance with the so-called dry etching technique. The present embodiment can adopt a known technique of performing plasma treatment in the atmospheric pressure.

Figure 4:
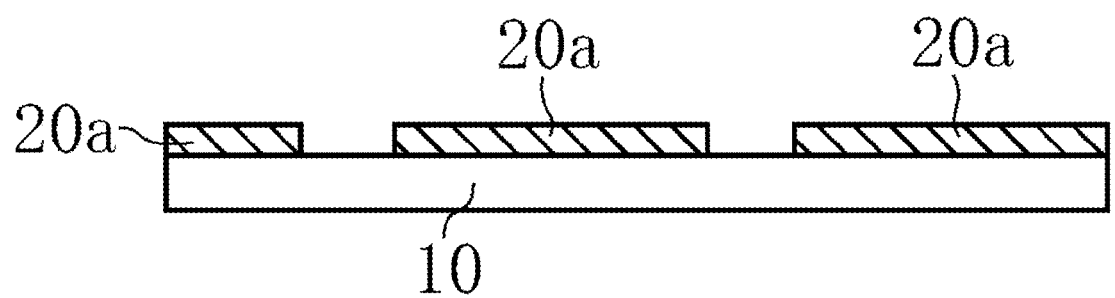
FIG. 4 is a sectional schematic view of a process in the manufacturing method of the multilayer capacitor according to the first embodiment of the present invention.

The firstly stacked electrode layer precursor layer 21a is then heated at 580° C. for about 15 minutes in the oxygen atmosphere so as to be mainly baked. As shown in FIG. 4, the firstly stacked electrode layer oxide layer 20a consisting of lanthanum (La) and nickel (Ni) (possibly including inevitable impurities; this applies hereinafter; also simply referred to as the "firstly stacked electrode layer") is thus formed on the substrate 10. Electrode oxide layers consisting of lanthanum (La) and nickel (Ni) (the firstly stacked electrode oxide layer a well as other electrode oxide layers) are also called LNO layers.

Examples of a precursor containing lanthanum (La) for the firstly stacked electrode layer 20a according to the present embodiment include lanthanum acetate. The examples also possibly include lanthanum nitrate, lanthanum chloride, and any lanthanum alkoxide (e.g. lanthanum isopropoxide, lanthanum butoxide, lanthanum ethoxide, or lanthanum methoxyethoxide). Examples of a precursor containing nickel (Ni) for the firstly stacked electrode layer 20a according to the present embodiment include nickel acetate. The examples also possibly include nickel nitrate, nickel chloride, and any nickel alkoxide (e.g. nickel isopropoxide, nickel butoxide, nickel ethoxide, or nickel methoxyethoxide).

The present embodiment adopts the firstly stacked electrode layer 20a consisting of lanthanum (La) and nickel (Ni), but the firstly stacked electrode layer 20a is not limited thereto in terms of its composition. The present embodiment can alternatively adopt a firstly stacked electrode layer consisting of antimony (Sb) and tin (Sn) (possibly including inevitable impurities; this applies hereinafter). In this case, examples of a precursor containing antimony (Sb) possibly include antimony acetate, antimony nitrate, antimony chloride, and any antimony alkoxide (e.g. antimony isopropoxide, antimony butoxide, antimony ethoxide, or antimony methoxyethoxide). Examples of a precursor containing tin (Sn) possibly include tin acetate, tin nitrate, tin chloride, and any tin alkoxide (e.g. tin isopropoxide, tin butoxide, tin ethoxide, or tin methoxyethoxide). The present embodiment can alternatively adopt oxide consisting of indium (In) and tin (Sn) (possibly including inevitable impurities; this applies hereinafter). In this case, examples of a precursor containing indium (In) possibly include indium acetate, indium nitrate, indium chloride, and any indium alkoxide (e.g. indium isopropoxide, indium butoxide, indium ethoxide, or indium methoxyethoxide). Examples of a precursor containing tin (Sn) are similar to those listed above.

(2) Formation of Firstly Stacked Dielectric Layer 30a

Figure 5:
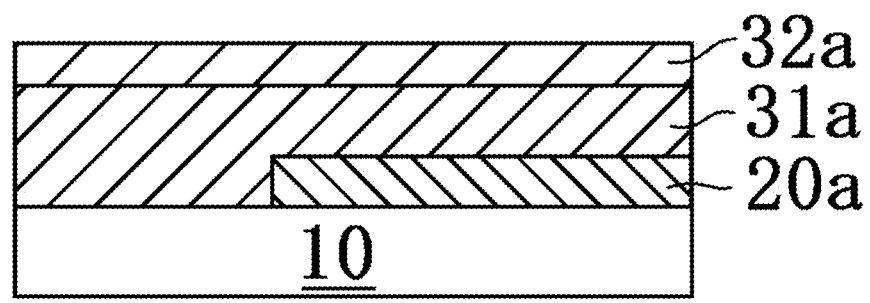
FIG. 5 is a sectional schematic view of a process in the manufacturing method of the multilayer capacitor according to the first embodiment of the present invention.

As shown in FIG. 5, formed on the substrate 10 in accordance with the known spin coating technique is a first precursor layer 31a obtained from a precursor solution as a start material including both a precursor containing bismuth (Bi) and a precursor containing niobium (Nb) as solutes (called a first precursor solution; hereinafter, this applies to a solution of a first precursor). The first precursor layer 31a is then heated at 250° C. for about five minutes so as to be preliminarily baked. This preliminary baking is performed in an atmosphere containing oxygen. This preliminary baking can sufficiently evaporate a solvent in the first precursor layer 31a and can cause a preferred gel state for exerting properties that enable future plastic deformation (possibly a state where organic chains remain before pyrolysis). The preliminary baking is performed preferably at a temperature in the range from 80° C. or more to 250° C. or less in order to reliably cause the above phenomena. The formation of the first precursor layer 31a in accordance with the spin coating technique and the preliminary baking were repeated for five times in the present embodiment, so as to eventually obtain a first oxide layer 31 of sufficient thickness (e.g. 180 nm).

Figure 6:
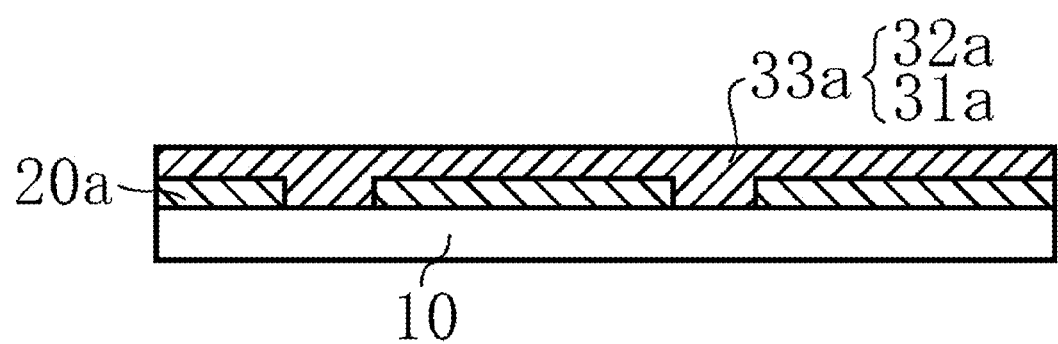
FIG. 6 is a sectional schematic view of a process in the manufacturing method of the multilayer capacitor according to the first embodiment of the present invention.

Subsequently formed on the first precursor layer 31a in accordance with the known spin coating technique is a second precursor layer 32a obtained from a precursor solution as a start material including both a precursor containing lanthanum (La) and a precursor containing tantalum (Ta) as solutes. The second precursor layer 32a is then heated at a temperature in the range from 80° C. or more to 250° C. or less (typically 250° C.) for about five minutes in an atmosphere containing oxygen so as to be preliminarily baked. The formation of the second precursor layer 32a in accordance with the spin coating technique and the preliminary baking were performed once in the present embodiment, so as to eventually obtain a second oxide layer 32 of sufficient thickness (e.g. 20 nm). As shown in FIG. 6, accordingly formed on the substrate 10 and the firstly stacked electrode layer 20a is a dielectric layer precursor layer 33a having a multilayer structure of the first precursor layer 31a and the second precursor layer 32a.

Figure 7:
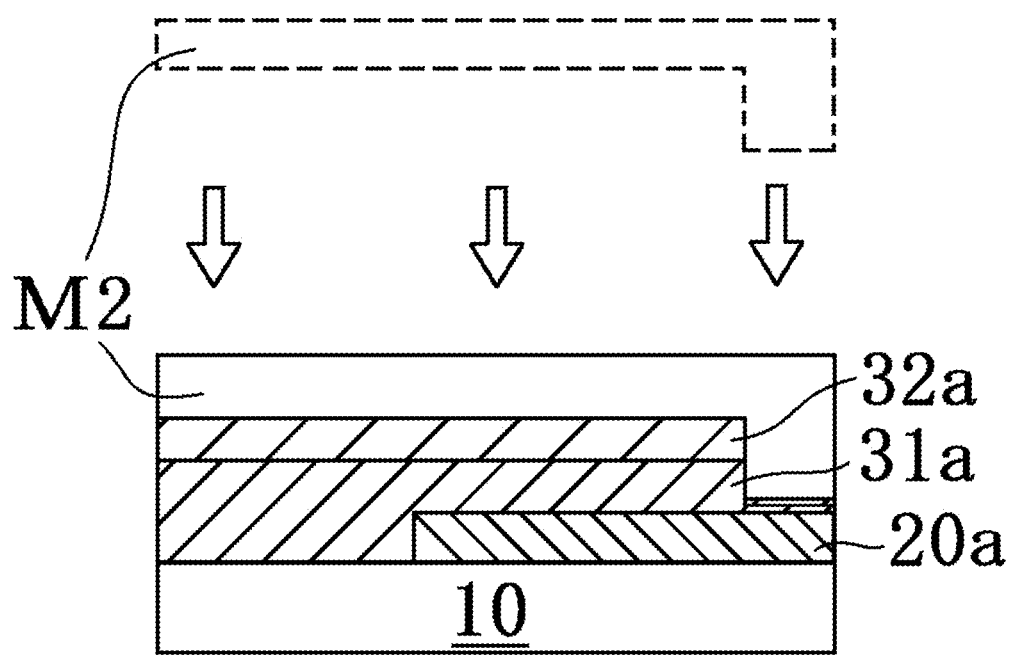
FIG. 7 is a sectional schematic view of a process in the manufacturing method of the multilayer capacitor according to the first embodiment of the present invention.

The stacked first and second precursor layers 31a and 32a only preliminarily baked are imprinted in the present embodiment. Specifically, as shown in FIG. 7, the imprinting is performed to pattern the dielectric layer 30a, using a dielectric layer mold M2 with a pressure of 1 MPa or more and 20 MPa or less (typically 5 MPa) while the first and second precursor layers 31a and 32a are heated at a temperature in the range from 80° C. or more to 300° C. Formed by this imprinting using the dielectric layer mold M2 according to the present embodiment is a multilayer structure of the first precursor layer 31a and the second precursor layer 32a each including a thick layer portion of about 100 nm to 300 nm thick and a thin layer portion of about 10 nm to 100 nm thick.

The dielectric layer precursor layer 33a is then entirely etched so that a gate dielectric layer precursor layer 33a is removed in the regions other than a region corresponding to the dielectric layer 30a (the step of entirely etching the dielectric layer precursor layer 33a). The step of etching the dielectric layer precursor layer 33a in the present embodiment is executed in accordance with the wet etching technique without adopting the vacuum process. The etching can be possibly performed using plasma, in accordance with the so-called dry etching technique.

Figure 8:
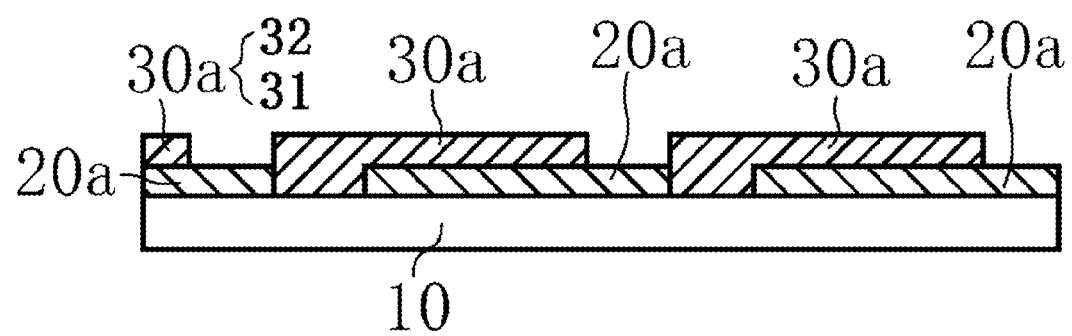
FIG. 8 is a sectional schematic view of a process in the manufacturing method of the multilayer capacitor according to the first embodiment of the present invention.

The first and second precursor layers 31a and 32a are then heated at 550° C. for about 20 minutes in the oxygen atmosphere so as to be mainly baked. As shown in FIG. 8, accordingly formed on the substrate 10 and the firstly stacked electrode layer 20a is multilayer oxide including the first oxide layer 31 consisting of bismuth (Bi) and niobium (Nb) (possibly including inevitable impurities; this applies hereinafter) and the second oxide layer 32 consisting of lanthanum (La) and tantalum (Ta) (possibly including inevitable impurities; this applies hereinafter). The first oxide layer 31 is about 50 nm to 250 nm thick whereas the second oxide layer 32 is about 5 nm to 50 nm thick in the present embodiment. The first oxide layer 31 consisting of bismuth (Bi) and niobium (Nb) is also called a BNO layer. The second oxide layer 32 consisting of lanthanum (La) and tantalum (Ta) is also called an LTO layer.

The multilayer capacitor 100 according to the present embodiment is provided with, as the dielectric layer 30a, stacked oxide layers including the first and second oxide layers 31 and 32.

Examples of a precursor containing bismuth (Bi) for the first oxide layer 31 according to the present embodiment include bismuth octylate. The examples also possibly include bismuth chloride, bismuth nitrate, and any bismuth alkoxide (e.g. bismuth isopropoxide, bismuth butoxide, bismuth ethoxide, or bismuth methoxyethoxide). Examples of a precursor containing niobium (Nb) for the first oxide layer 31 according to the present embodiment include niobium octylate. The examples also possibly include niobium chloride, niobium nitrate, and any niobium alkoxide (e.g. niobium isopropoxide, niobium butoxide, niobium ethoxide, or niobium methoxyethoxide).

Examples of a precursor containing lanthanum (La) for the second oxide layer 32 according to the present embodiment include lanthanum acetate. The examples also possibly include lanthanum nitrate, lanthanum chloride, and any lanthanum alkoxide (e.g. lanthanum isopropoxide, lanthanum butoxide, lanthanum ethoxide, or lanthanum methoxyethoxide). Examples of a precursor containing tantalum (Ta) for the second oxide layer 32 according to the present embodiment include tantalum butoxide. The examples also possibly include tantalum nitrate, tantalum chloride, and any tantalum alkoxide (e.g. tantalum isopropoxide, tantalum butoxide, tantalum ethoxide, or tantalum methoxyethoxide).

Atomic composition ratio between bismuth (Bi) assumed to be 1 and niobium (Nb) was 1:1 in the first oxide layer 31 according to the present embodiment. Atomic composition ratio between lanthanum (La) assumed to be 1 and tantalum (Ta) was 1:1.5 in the second oxide layer 32 according to the present embodiment. The first oxide layer 31 was about 160 nm thick whereas the second oxide layer 32 was about 20 nm thick in this case. If atomic composition ratio of niobium (Nb) to bismuth (Bi) assumed to be 1 is in the range from 0.33 or more to 3 or less in the first oxide layer 31, at least some of the effects of the present embodiment can be exerted reliably. If atomic composition ratio of tantalum (Ta) to lanthanum (La) assumed to be 1 is in the range from 0.11 or more to 9 or less in the second oxide layer 32, at least some of the effects of the present embodiment can be exerted reliably.

The present embodiment adopts the second oxide layer 32 consisting of lanthanum (La) and tantalum (Ta), but the second oxide layer 32 is not limited thereto in terms of its composition. The present embodiment can alternatively adopt a second oxide layer consisting of lanthanum (La) and zirconium (Zr) (possibly including inevitable impurities; this applies hereinafter; also called an LZO layer). Examples of a precursor containing lanthanum (La) in this case include lanthanum acetate. The examples also possibly include lanthanum nitrate, lanthanum chloride, and any lanthanum alkoxide (e.g. lanthanum isopropoxide, lanthanum butoxide, lanthanum ethoxide, or lanthanum methoxyethoxide). Examples of a precursor containing zirconium (Zr) include zirconium butoxide. The examples also possibly include zirconium nitrate, zirconium chloride, and any zirconium alkoxide (e.g. zirconium isopropoxide, zirconium butoxide, zirconium ethoxide, or zirconium methoxyethoxide). The present embodiment can alternatively adopt a second oxide layer consisting of strontium (Sr) and tantalum (Ta) (possibly including inevitable impurities; this applies hereinafter; also called an STO layer). Examples of a precursor containing strontium (Sr) in this case include strontium acetate. The examples also possibly include strontium nitrate, strontium chloride, and any strontium alkoxide (e.g. strontium isopropoxide, strontium butoxide, strontium ethoxide, or strontium methoxyethoxide). Examples of a precursor containing tantalum (Ta) are similar to those listed above.

Atomic composition ratio between lanthanum (La) assumed to be 1 and zirconium (Zr) was 1:1.5 in the second oxide layer 32 according to the present embodiment. If atomic composition ratio of zirconium (Zr) to lanthanum (La) assumed to be 1 is in the range from 0.11 or more to 9 or less in the second oxide layer 32, at least some of the effects of the present embodiment can be exerted reliably.

Atomic composition ratio between strontium (Sr) assumed to be 1 and tantalum (Ta) was 1:1.5 in the second oxide layer 32 according to the present embodiment. If atomic composition ratio of tantalum (Ta) to strontium (Sr) assumed to be 1 is in the range from 0.11 or more to 9 or less in the second oxide layer 32, at least some of the effects of the present embodiment can be exerted reliably.

The inventors have found, through researches, that heating the stacked first and second precursor layers 31a and 32a at a temperature in the range from 80° C. or more to 300° C. or less during the imprinting achieves improvement in plastic deformability of the first and second precursor layers 31a and 32a and sufficient removal of a main solvent. In view of the above, according to a preferred aspect, the first and second precursor layers 31a and 32a are heated at a temperature in the range from 80° C. or more to 300° C. or less for the imprinting. If the heating temperature for the imprinting is less than 80° C., the temperatures of the first and second precursor layers 31a and 32a decrease to deteriorate plastic deformability of the respective precursor layers. This leads to lower moldability during formation of an imprinted structure, or lower reliability or stability after the formation. In contrast, if the heating temperature for the imprinting exceeds 300° C., decomposition of organic chains (oxidative pyrolysis) exerting plastic deformability proceeds and the plastic deformability thus deteriorates. In view of the above, according to a more preferred aspect, the first precursor layer 31a and the second precursor layer 32a are heated at a temperature in the range from 100° C. or more to 250° C. or less for the imprinting.

(3) Formation of Secondly and Subsequently Stacked Electrode Layers and Dielectric Layers Subsequently performed are alternately stacking electrode layers and dielectric layers in similar manners to the above manufacturing steps of the electrode layer (the firstly stacked electrode layer 20a) and the dielectric layer 30a having the multilayer structure, as well as patterning by imprinting. The multilayer capacitor as a single unit is formed so as to have only the multilayer structure including each one of the firstly stacked electrode layer 20a, the first oxide layer 31, the second oxide layer 32, and the secondly stacked electrode layer 20b to be described later. The multilayer capacitor 100 according to the present embodiment can be formed by further stacking each one of the above layers so as to have a plurality of units.

Figure 9:
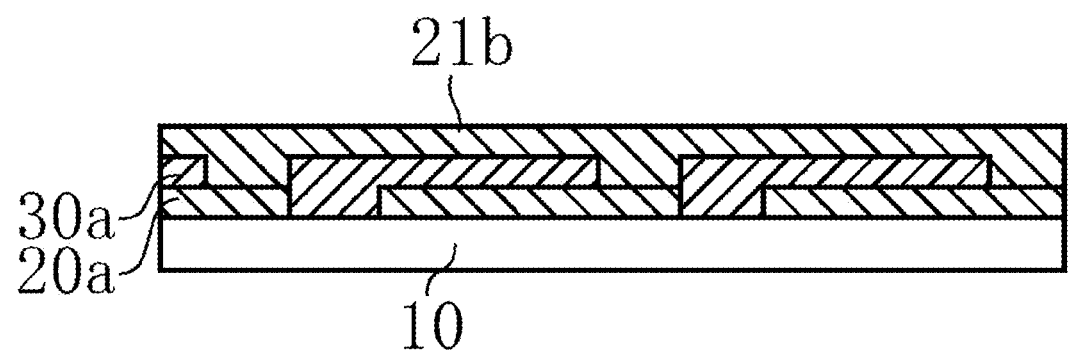
FIG. 9 is a sectional schematic view of a process in the manufacturing method of the multilayer capacitor according to the first embodiment of the present invention.
Figure 10:
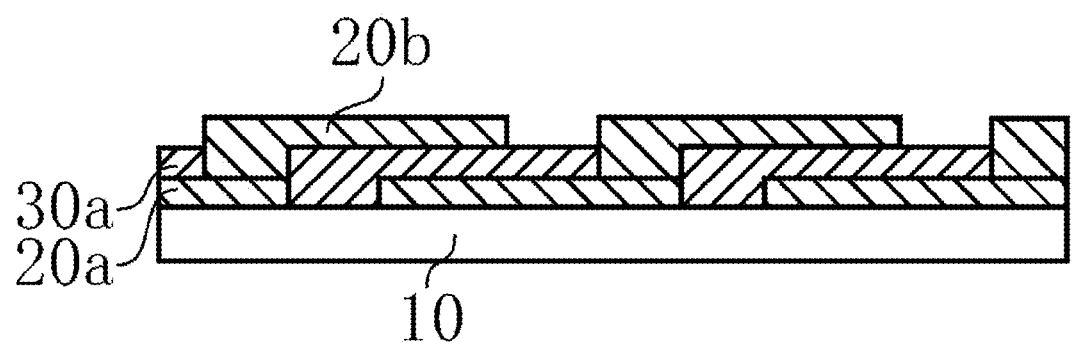
FIG. 10 is a sectional schematic view of a process in the manufacturing method of the multilayer capacitor according to the first embodiment of the present invention.

Specifically, as shown in FIG. 9, formed on the firstly stacked dielectric layer 30a and the firstly stacked electrode layer 20a after the dielectric layer 30a is patterned is a secondly stacked electrode layer precursor layer 21b made of the same material as that of the firstly stacked electrode layer precursor layer 21a similarly to the firstly stacked electrode layer precursor layer 21a. As shown in FIG. 10, the secondly stacked electrode layer 20b being patterned is then formed similarly to the firstly stacked electrode layer 20a. Used for imprinting to pattern the secondly stacked electrode layer 20b is a mold (also referred to as a mold M3 for the convenience purpose) in a shape recessed and projecting differently in position and depth from the electrode layer mold M1 and the dielectric layer mold M2.

Figure 11:
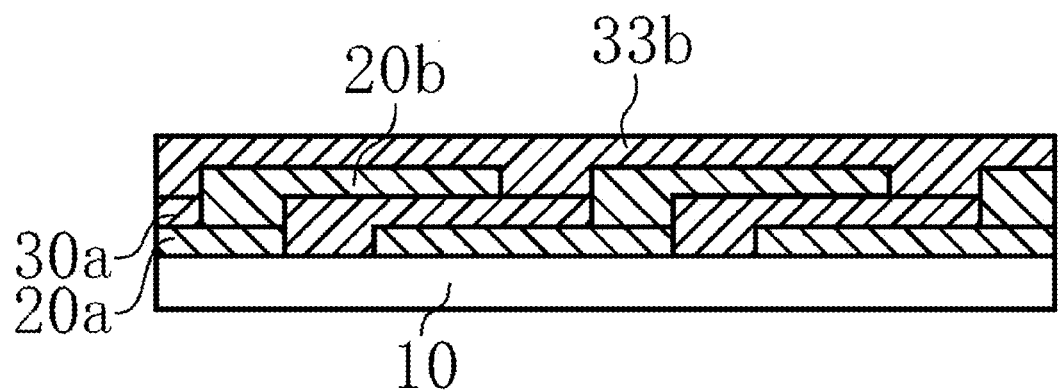
FIG. 11 is a sectional schematic view of a process in the manufacturing method of the multilayer capacitor according to the first embodiment of the present invention.
Figure 12:
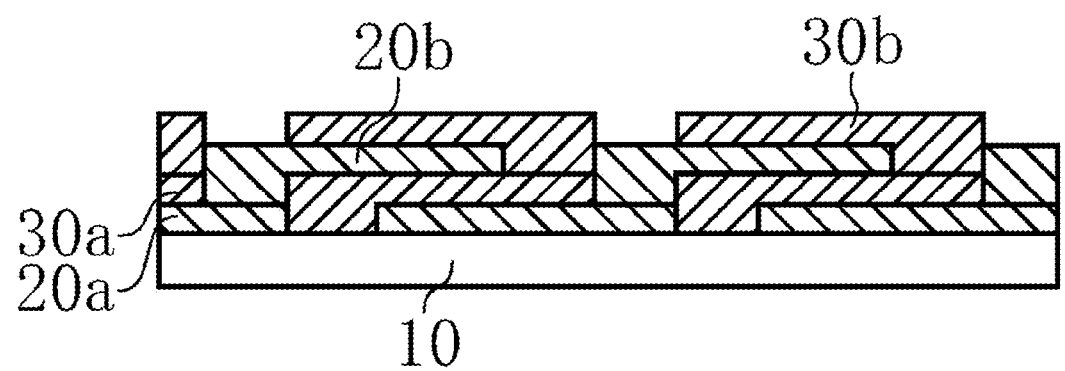
FIG. 12 is a sectional schematic view of a process in the manufacturing method of the multilayer capacitor according to the first embodiment of the present invention.

As shown in FIG. 11, subsequently formed on the secondly stacked electrode layer 20b and the firstly stacked dielectric layer 30a is a secondly stacked dielectric layer precursor layer 33b made of the same material as that of the firstly stacked dielectric layer precursor layer 33a (specifically, stacked oxide layers including the first precursor layer 31a and the second precursor layer 32a) similarly to the firstly stacked dielectric layer precursor layer 33a. As shown in FIG. 12, the secondly stacked dielectric layer 30b being patterned is then formed similarly to the firstly stacked dielectric layer 30a. The dielectric layer mold M2 is used for imprinting to pattern the secondly stacked dielectric layer 30b.

The multilayer capacitor 100 shown in FIG. 1 is finally manufactured by alternately stacking the electrode layers and the dielectric layers and patterning by imprinting.

As described above, it should be noted that the electrode layers and the dielectric layers are each made of metal oxide in the multilayer capacitor 100 according to the present embodiment. Furthermore, the electrode layers and the dielectric layers are formed by heating the corresponding precursor solutions in an atmosphere containing oxygen in the present embodiment. Accordingly, increase in area is facilitated and improvement from the industrial and mass productivity perspectives is significantly achieved in comparison to a conventional method.

Those skilled in the art will be able to understand, from the details of this application, that electrode layers and dielectric layers can be stacked above by further alternately repeating the forming steps thereof. In the present embodiment, the firstly stacked electrode layer 20a, the secondly stacked electrode layer 20b, the thirdly stacked electrode layer 20c, and the fourthly stacked electrode layer 20d can each serve as the "first electrode layer" in this application. In the present embodiment, the secondly stacked electrode layer 20b, the thirdly stacked electrode layer 20c, and the fourthly stacked electrode layer 20d can each serve as the "second electrode layer" in this application.

1. Observation in Sectional TEM

Figure 13:
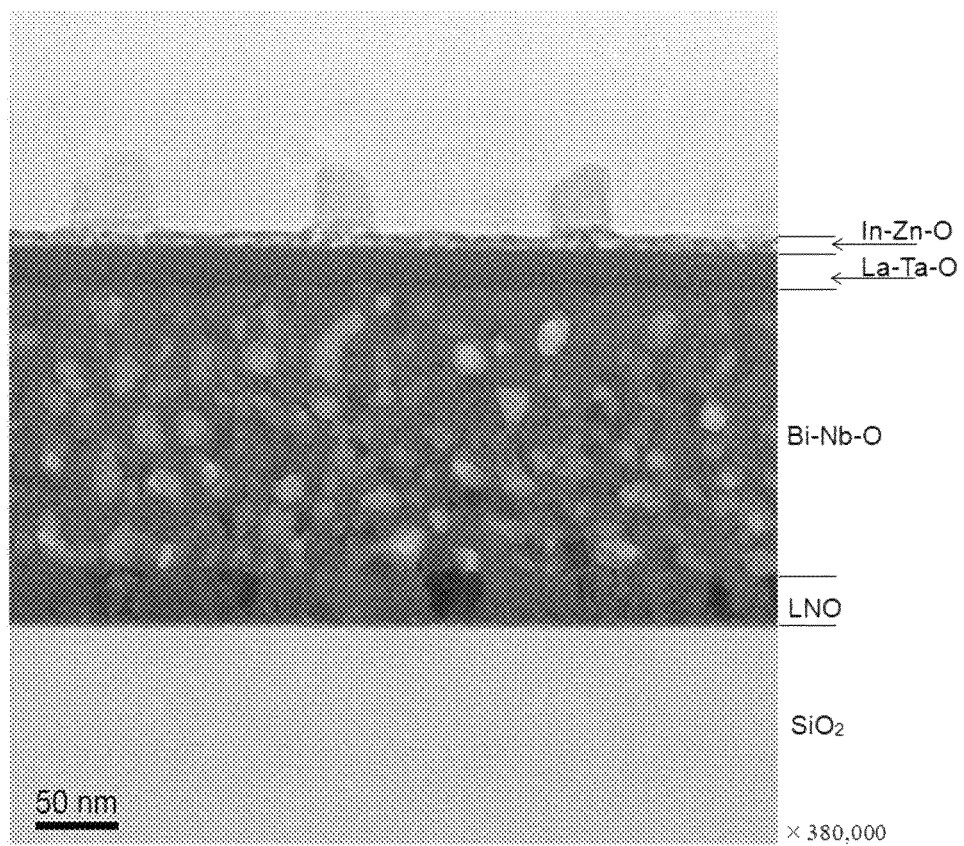
FIG. 13 includes a cross-sectional TEM picture and an electron beam diffraction image each showing a crystal structure of an oxide layer in the first embodiment of the present invention.

Found through the various analysis processes was that the first oxide layer 31 in the dielectric layer made of multilayer oxide includes a crystal phase and an amorphous phase. More particularly, the first oxide layer 31 was found to include a crystal phase, a fine crystal phase, and an amorphous phase. FIG. 13 is a cross-sectional transmission electron microscopy (TEM) picture showing a multilayer structure including first oxide manufactured in the same step as the manufacturing step of the first oxide layer 31 according to the first embodiment. As shown in FIG. 13, the first oxide layer 31 was found to at least partially include a region having a crystal structure. More particularly, an amorphous phase, a fine crystal phase, and a crystal phase were found in the first oxide layer 31. The "fine crystal phase" in this application means a crystal phase that is not uniformly grown from the upper end to the lower end in the thickness direction of a layered material. According to the subsequent researches by the inventors, the first oxide layer 31 has an amorphous form including the fine crystal phase so that the first oxide layer 31 is expected to have generally high permittivity but have a leakage current value exceeding an applicable range to a multilayer capacitor and low surface flatness.

Figure 14:
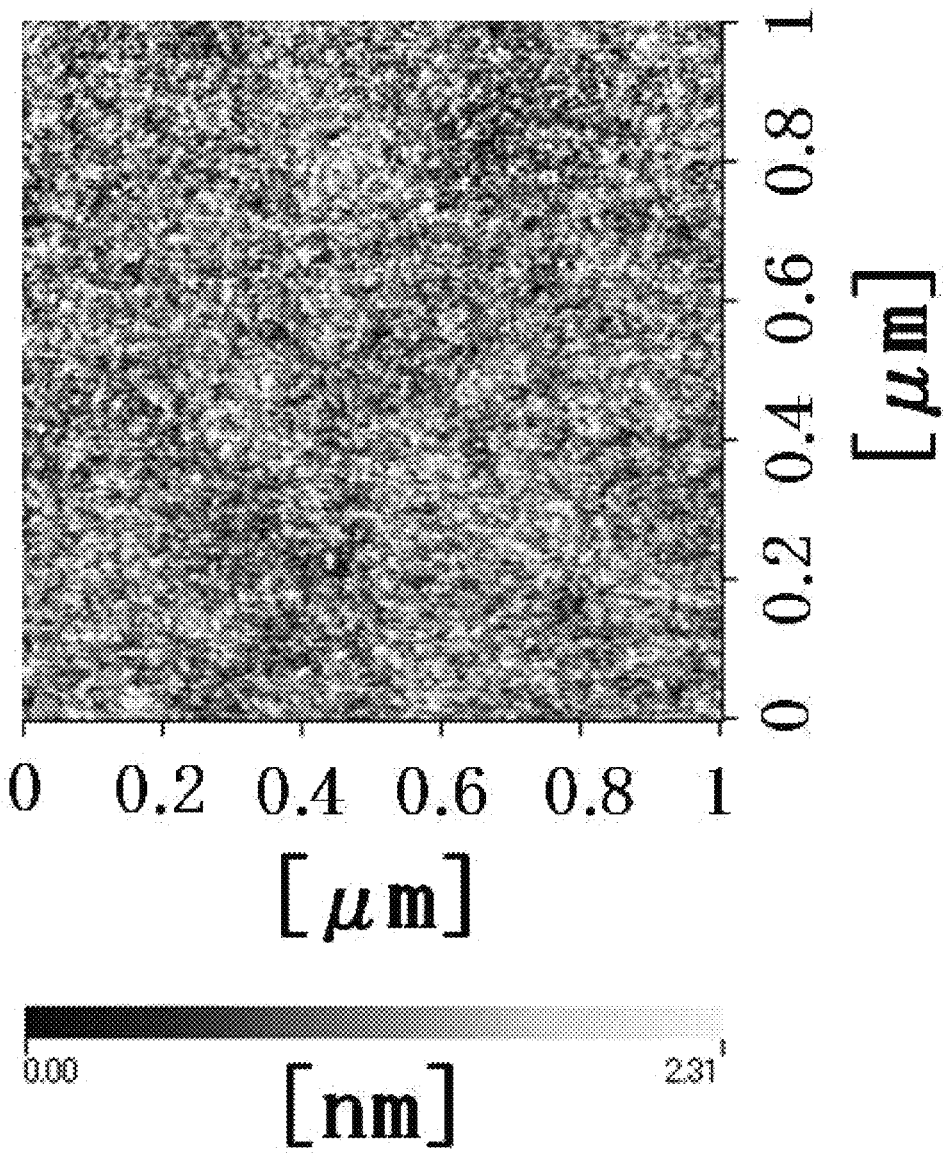
FIG. 14 includes a cross-sectional TEM picture and an electron beam diffraction image each showing a crystal structure of an oxide layer in a comparative example.
Figure 19:
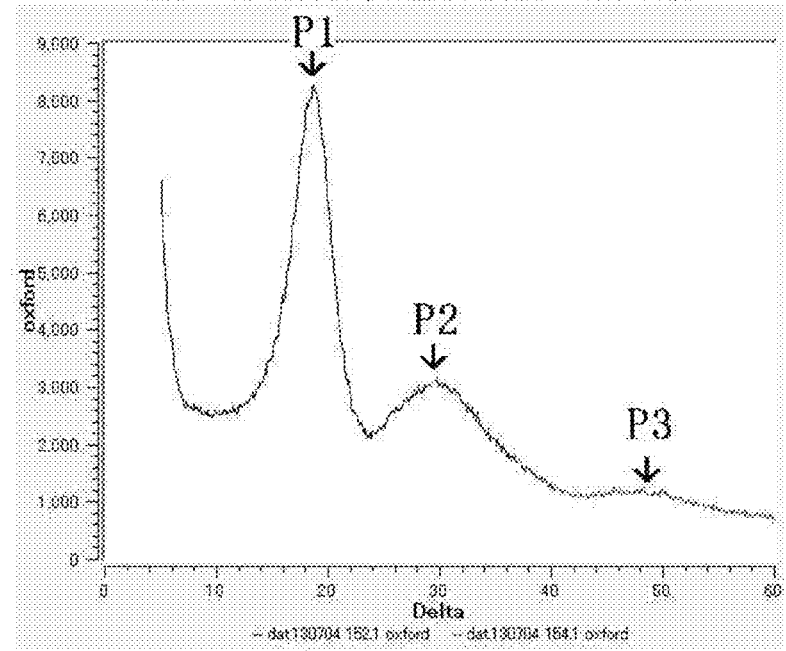
FIG. 19 is a graph indicating an analysis result of an LZO layer with use of a Japanese "Spring-8, BL13XU apparatus".

Meanwhile, the second oxide layer 32 was interestingly found to be a layer in a substantially amorphous form with no specific crystal structure being found. As shown in FIG. 19 to be referred to later, the phrase "in a substantially amorphous form" in this application means that the second oxide layer 32 macroscopically has an amorphous form but has atomic arrangement partially with certain regularity in the order of less than nanometer (typically in the order of angstrom). FIG. 14 is an atomic force microscopy (AFM) image of a surface of a second oxide layer manufactured through the same step as the manufacturing step of the second oxide layer 32 according to the first embodiment. As shown in FIG. 14, the second oxide layer 32 is found to have a substantially amorphous form unlike the first oxide layer 31 having a specific crystal structure. The second oxide layer 32 in such a form is expected to contribute to formation of a preferred interface (an interface with less atomic interdiffusion) bonded with an electrode layer (e.g. the secondly stacked electrode layer 20b) and accordingly lead to decrease in leakage current. The first and second oxide layers 31 and 32 according to the present embodiment are formed in an imperfectly crystallized state so as to exert the electric properties mentioned above. It is thus noted that a gate dielectric layer 30 according to the present embodiment is formed by heating at a relatively low temperature.

The present embodiment exemplifies the multilayer capacitor 100 according to an aspect. Application examples of the stacked dielectric layer described above are not limited to such a multilayer capacitor. According to a different preferred aspect, dielectric multilayer oxide formed by stacking first oxide that has relatively high permittivity but relatively large leakage current and second oxide that has relatively low permittivity, quite a small leakage current, and excellent surface flatness, is possibly applicable to various solid-state electronic devices (e.g. a semiconductor device or a microscopic electromechanical system). Specifically, the multilayer oxide is expected to exert the advantages of the second oxide for the leakage current value and the flatness and exert the advantages of the first oxide for the permittivity and thus exerts the interesting properties. The multilayer oxide is accordingly applicable to various solid-state electronic devices (e.g. a capacitor, a semiconductor device, or a microscopic electromechanical system).

According to a possible different preferred aspect, in view of exertion of the various properties mentioned above, the multilayer oxide is applicable to other various solid-state electronic devices (e.g. a semiconductor device or a microscopic electromechanical system) not according to the present embodiment, each of which partially has a multilayer structure of the single electrode layer and the single dielectric layer according to the present embodiment.

Second Embodiment

The present embodiment is similar to the first embodiment except for a difference in second oxide layer. Accordingly, the configurations similar to those of the first embodiment may not be described repeatedly.

The second oxide layer according to the present embodiment is made of so-called complex oxide that consists of lanthanum (La) and zirconium (Zr) and is obtained from a precursor solution including both a precursor containing lanthanum (La) and a precursor containing zirconium (Zr) as solutes. Atomic composition ratio between lanthanum (La) assumed to be 3 and zirconium (Zr) was 3:7 in the second oxide layer according to the present embodiment. The first oxide layer was about 160 nm thick whereas the second oxide layer was about 20 nm thick in this case.

As described above, even the second oxide layer consisting of lanthanum (La) and zirconium (Zr) can exert at least some of the effects of the multilayer capacitor 100 according to the first embodiment or each of the other various solid-state electronic devices.

Third Embodiment

The present embodiment is again similar to the second embodiment except for a difference in second oxide layer. Accordingly, the configurations similar to those of the first embodiment may not be described repeatedly.

The second oxide layer according to the present embodiment is made of so-called complex oxide that consists of strontium (Sr) and tantalum (Ta) and is obtained from a precursor solution including both a precursor containing strontium (Sr) and a precursor containing tantalum (Ta) as solutes. Atomic composition ratio between strontium (Sr) and tantalum (Ta) was 1:1 in the second oxide layer according to the present embodiment. The first oxide layer 31 was about 160 nm thick whereas the second oxide layer was about 20 nm thick in this case.

As described above, even the second oxide layer consisting of strontium (Sr) and tantalum (Ta) can exert at least some of the effects of the multilayer capacitor 100 according to the first embodiment or each of the other various solid-state electronic devices.

The leakage current value was typically in the order of not more than $10^{-7}$ A/cm$^2$ at 1 MV/cm in both of the cases where the oxide layer according to the second embodiment and the oxide layer according to the third embodiment are adopted. The second oxide layer consisting of lanthanum (La) and zirconium (Zr) had a leakage current value typically in the order of not more than $10^{-8}$ A/cm$^2$ at 1 MV/cm.

When the LTO layer is adopted as the second oxide layer, the multilayer oxide of the first oxide layer 31 as the BNO layer and the second oxide layer had combined relative permittivity $\in_r$ of about 123. When the LZO layer is adopted as the second oxide layer, the multilayer oxide of the first oxide layer 31 and the second oxide layer had combined relative permittivity $\in_r$ of about 94. When the STO layer is adopted as the second oxide layer, it should be noted that the multilayer oxide of the first oxide layer 31 and the second oxide layer had combined relative permittivity $\in_r$ as high as about 134.

The first oxide layer 31 according to each of the embodiments described above is formed by baking a precursor solution including both a precursor containing bismuth (Bi) and a precursor containing niobium (Nb) as solutes. In this application, the above method of forming the first oxide layer 31 or a different oxide layer by baking a precursor solution as a start material is also called the "solution technique" for the convenience purpose. The first oxide layer 31 formed in accordance with the solution technique configures a preferred dielectric layer also in terms of small dielectric loss.

Figure 15:
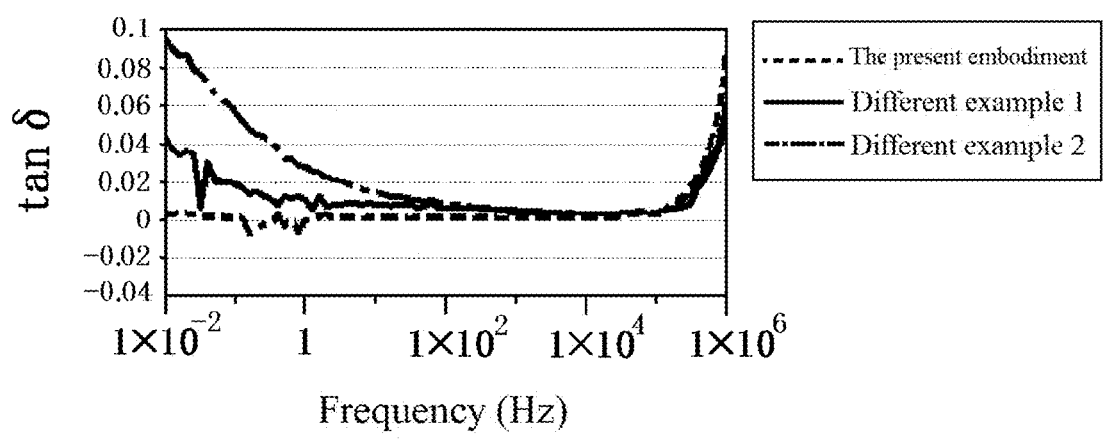
FIG. 15 is a graph indicating a tan δ value relative to a frequency (Hz) of a first oxide layer according to the first embodiment and oxide layers according to different embodiments of the present invention.

FIG. 15 is a graph of a tan δ value indicating a ratio of dielectric loss to a frequency (Hz) of the first oxide layer 31 formed in accordance with the solution technique. FIG. 15 indicates the results of a BNO layer formed in accordance with the known sputtering technique in "a different example 1" as a modification example of the first oxide layer 31 in the present embodiment as well as of complex oxide (a BZNO layer) consisting of bismuth (Bi), zinc (Zn), and niobium (Nb) and formed in accordance with the solution technique similarly to the first embodiment in "a different example 2".

Examples of a precursor containing bismuth (Bi) in a precursor solution of the complex oxide according to the different example 2 include bismuth octylate. The examples also possibly include bismuth chloride, bismuth nitrate, and any bismuth alkoxide. Examples of a precursor containing zinc (Zn) include zinc chloride. The examples also possibly include zinc nitrate, zinc acetate, and any zinc alkoxide (e.g. zinc isopropoxide, zinc butoxide, zinc ethoxide, or zinc methoxyethoxide). According to a preferred aspect, when zinc acetate is selected as a precursor containing zinc (Zn), a small amount of monoethanolamine is added as an additive to the zinc acetate in order to improve solubility of zinc. Examples of the additive can also include diethylaminoethanol, acetylacetone, and diethanolamine Examples of a precursor containing niobium (Nb) include niobium octylate.

The examples also possibly include niobium chloride, niobium nitrate, and any niobium alkoxide (e.g. niobium isopropoxide, niobium butoxide, niobium ethoxide, or niobium methoxyethoxide).

As indicated in FIG. 15, the first oxide layer 31 according to the present embodiment and the BNO layer formed in accordance with the sputtering technique (the different example 1) were found to have a smaller tan δ value or smaller dielectric loss as compared to that of the different example 2. The first oxide layer 31 formed in accordance with the solution technique was found to have less dielectric loss than that of the BNO layer formed in accordance with the sputtering technique (the different example 1) even if these layers are identical in composition.

As described above, the first oxide layer 31 formed in accordance with the solution technique has the properties of high relative permittivity and low dielectric loss. Furthermore, the first oxide layer 31 is formed in a relatively short time period with no need for complex and expensive equipment such as a vacuum system. These features remarkably contribute to provision of an excellent multilayer capacitor or each of the other various solid-state electronic devices from the industrial and mass productivity perspectives. Similarly, the second oxide layer is formed in accordance with the solution technique in a relatively short time period with no need for complex and expensive equipment such as a vacuum system. These features remarkably contribute to provision of an excellent multilayer capacitor or each of the other various solid-state electronic devices from the industrial and mass productivity perspectives. The multilayer capacitor or each of the other various solid-state electronic devices including the first oxide layer 31 formed in accordance with the solution technique is thus excellent in that the multilayer capacitor or each of the other various solid-state electronic devices can be improved in performance with the first oxide layer 31 containing no zinc (Zn). Although the BZNO layer adopted in the "different example 2" is worse in dielectric loss than the first oxide layer 31 (that is, the BNO layer), the multilayer capacitor or each of the other various solid-state electronic devices including the BZNO layer has relatively small leakage current. The BZNO layer can be thus exemplified as a substitute for the BNO layer.

Fourth Embodiment

A solid-state electronic device according to the present embodiment is similar to that according to the first embodiment except that a single electrode layer and a single dielectric layer (multilayer oxide of a first oxide layer and a second oxide layer) are stacked. Accordingly, the configurations similar to those of the first embodiment may not be described repeatedly. More specifically, there is formed only one "sandwich structure" including the above electrode layers and the above dielectric layer interposed between the electrode layers.

Structure of Multilayer Capacitor 200

Figure 16:
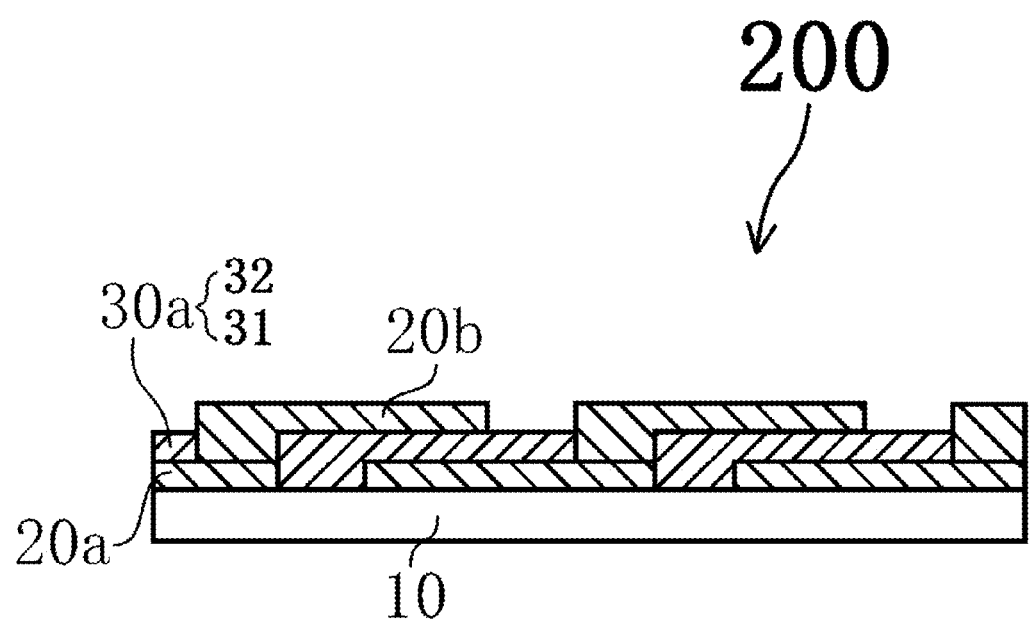
FIG. 16 is a sectional schematic view of a structure of a multilayer capacitor according to a fourth embodiment of the present invention.

FIG. 16 is a sectional schematic view of a structure of the multilayer capacitor 200 exemplifying a solid-state electronic device according to the present embodiment. As shown in FIG. 16, the multilayer capacitor 200 according to the present embodiment partially has a structure in which two electrode layers and a single dielectric layer are stacked alternately. In a portion where the electrode layers and the dielectric layer are not stacked alternately, the electrode layers are provided such that a lower one of the electrode layers (e.g. the firstly stacked electrode layer 20a) and an upper one of the electrode layers (e.g. the secondly stacked electrode layer 20b) are electrically connected to each other. Separated positions by dicing after formation of the respective layers are similar to those of the multilayer capacitor 100 according to the first embodiment.

Manufacturing Steps of Multilayer Capacitor 200

The multilayer capacitor 200 according to the present embodiment is manufactured through the steps shown in FIGS. 2 to 10 similarly to the multilayer capacitor 100 according to the first embodiment. The manufacturing method will not be described repeatedly.

The multilayer capacitor 200 according to the present embodiment is different in number of stacked electrode layers and dielectric layers from the multilayer capacitor 100 according to the first embodiment. The multilayer capacitor 200 can exert major effects of the multilayer capacitor 100 according to the first embodiment. Specifically, the first oxide layer 31 in the multilayer capacitor 200 was found to have relatively high permittivity similarly to the multilayer capacitor 100 according to the first embodiment, but have a large leakage current value with low surface flatness. The second oxide layer 32 in the multilayer capacitor 200 was found to have relatively low permittivity similarly to the multilayer capacitor 100 according to the first embodiment, but have a quite small leakage current value with excellent surface flatness. There was found an interesting result that the multilayer oxide is expected to exert the advantages of the second oxide layer 32 for the leakage current value and the flatness and exert the advantages of the first oxide layer 31 for the permittivity.

The major effects described above can be possibly exerted even by a multilayer capacitor according to the second embodiment, the third embodiment, or an embodiment relevant to the BZNO layer, which is manufactured as the multilayer capacitor according to a modification example of the present embodiment and has the structure in which two electrode layers and a single dielectric layer are stacked alternately.

Other Analysis Results on Multilayer Capacitors 100 and 200

The following interesting facts were found through researches and analysis by the inventors on the first oxide layer 31, particularly the BNO layer. These facts are in common between the first and second embodiments.

Figure 17:
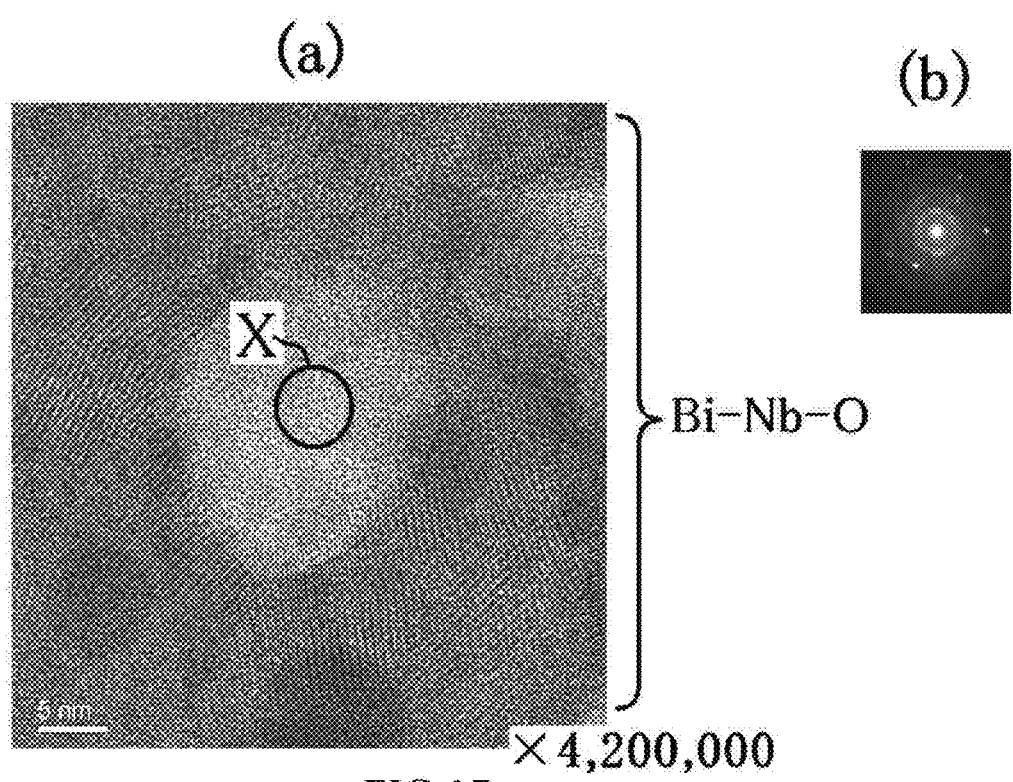
FIGS. 17(a) and 17(b) are a cross-sectional TEM picture and an electron beam diffraction image each showing a crystal structure of a BNO layer in the first oxide layer in the multilayer capacitor according to each embodiment of the present invention.
Figure 18:
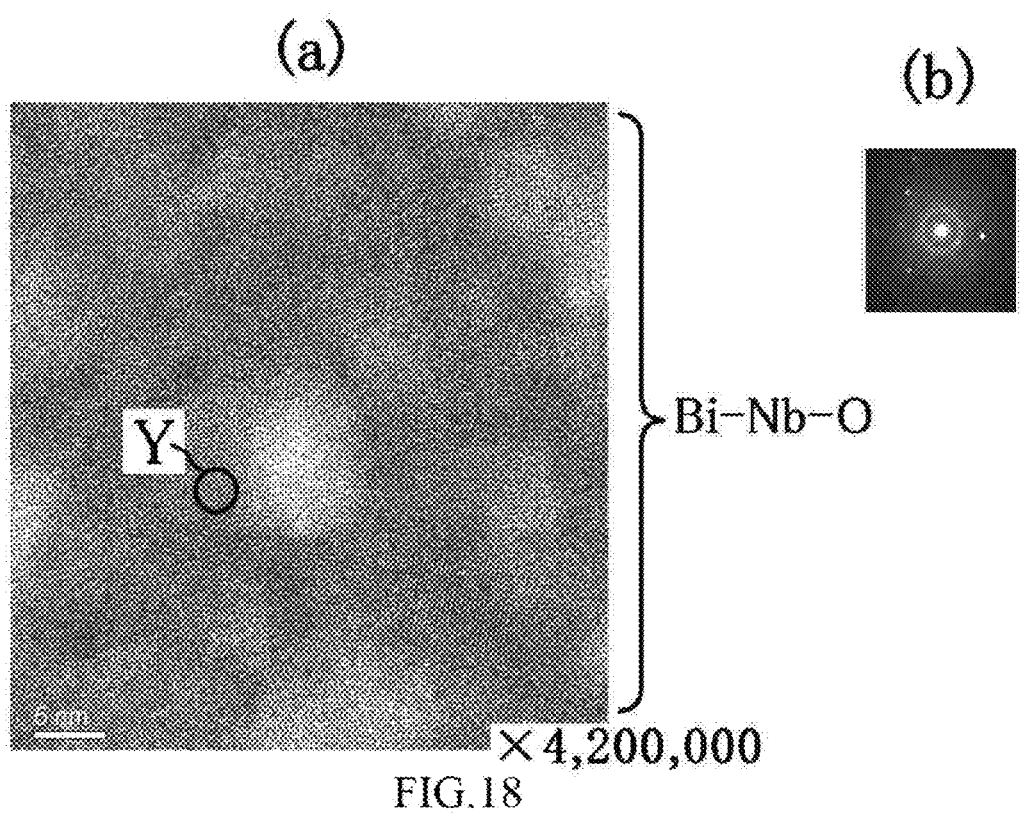
FIGS. 18(a) and 18(b) are a cross-sectional TEM picture and an electron beam diffraction image each showing a crystal structure of a BNO layer formed in a comparative example (the sputtering technique).

A. Crystal Structure Analysis by Cross-Sectional TEM Picture and Electron Beam Diffraction FIGS. 17(a) and 17(b) are a cross-sectional TEM picture and an electron beam diffraction image each showing a crystal structure of the BNO layer in the first oxide layer 31. FIG. 17(a) is the cross-sectional TEM picture of the BNO layer in the first oxide layer 31. FIG. 17(b) is the electron beam diffraction image of a region X in the cross-sectional TEM picture of the BNO layer shown in FIG. 17(a). FIGS. 18(a) and 18(b) are a cross-sectional TEM picture and an electron beam diffraction image each showing a crystal structure of a BNO layer formed in a comparative example (the sputtering technique). FIG. 18(a) is the cross-sectional TEM picture showing the crystal structure of the BNO layer formed in the comparative example (the sputtering technique). FIG. 18(b) is the electron beam diffraction image of a region Y in the cross-sectional TEM picture of the BNO layer shown in FIG. 18(a). FIGS. 17(a) to 18(b) indicate data on a platinum electrode layer in order to minimize the effects of an electrode layer.

From the results of the cross-sectional TEM picture and the electron beam diffraction image shown in FIGS. 17(a) and 17(b), it was found that the BNO layer according to the present example includes a crystal phase and an amorphous phase. More particularly, the BNO layer was found to include a crystal phase, a fine crystal phase, and an amorphous phase. The "fine crystal phase" in this application means a crystal phase that is not uniformly grown from the upper end to the lower end in the thickness direction of a layered material. Furthermore, fitting with a known crystal structure model in accordance with a Miller index and an interatomic distance indicated that the BNO layer has a fine crystal phase of the pyrochlore crystal structure expressed by a general formula of $A_2B_2O_7$ (where A is a metal element and B is a transition metal element; this applies hereinafter) and a crystal phase of the triclinic $\beta$-$BiNbO_4$ crystal structure.

It was interestingly found that the fine crystal phase of the pyrochlore crystal structure appears although the BNO layer in the first oxide layer 31 does not contain zinc. More specifically, the pyrochlore crystal structure was found to be either the $(Bi_{1.5}Zn_{0.5})(Zn_{0.5}Nb_{1.5})O_7$ structure or substantially identical with or approximate to the $(Bi_{1.5}Zn_{0.5})(Zn_{0.5}Nb_{1.5})O_7$ structure.

The already known pyrochlore crystal structure can be obtained by including "zinc", but the BNO layer in the first oxide layer 31 according to the embodiment had a result different from that according to the known aspect. It has not yet been clarified at the present stage why such a pyrochlore crystal structure appears in the composition not containing zinc as in the BNO layer in the first oxide layer 31 according to the above embodiment. As to be described later, it was found that provision of a crystal phase of the pyrochlore crystal structure leads to preferred dielectric properties (high relative permittivity in particular).

The cross-sectional TEM picture and the electron beam diffraction image were checked as to the BNO layer formed in accordance with the known sputtering technique in the comparative example. As indicated in FIGS. 18(a) and 18(b), neither fine crystal phase of the pyrochlore crystal structure nor crystal phase of the $\beta$-$BiNbO_4$ crystal structure was found in the BNO layer formed in accordance with the sputtering technique. Instead, a fine crystal phase of the $Bi_3NbO_7$ crystal structure was found in the comparative example. The BNO layer according to the comparative example had relative permittivity as low as 50.

The inventors of this application have obtained different interesting finding through further detailed analysis on the second oxide layer as each of the LTO layer, the LZO layer, and the STO layer.

Specifically, each of the LTO layer, the LZO layer, and the STO layer has macroscopically an amorphous form but is found, through extremely microscopic analysis, to have atomic arrangement partially with certain regularity in the order of less than nanometer (typically in the order of angstrom). For example, FIG. 19 is a graph indicating an analysis result of an LZO layer with use of a Japanese "Spring-8, BL13XU apparatus". This LZO layer is formed by baking at 400° C. Obtained through this analysis is regularity of atomic arrangement in an extremely microscopic order (typically in the order of less than nanometer). The LZO layer is a measurement target. The measurement was performed under the following conditions.

Measurement Conditions
  Photo energy: 12.4 keV
  Multi-axis diffractometer, under He flow
  out-of-plane
  Incidence angle: from 0.1 to 0.7 deg. (mostly from 0.1 to 0.3 deg.)

As indicated in FIG. 19, three peaks P1 to P3 were recognized by this analysis. Because these peaks were recognized, the LZO layer is found to have atomic arrangement partially with certain regularity in the order of less than nanometer (typically in the order of angstrom).

B. Distribution Analysis on Crystal Phases having Different Permittivity

Figure 20:
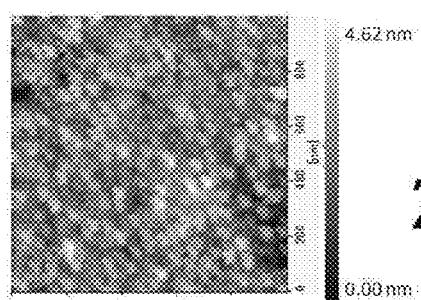
FIGS. 20(a) and 20(b) are a TOPO image (by a scanning probe microscope (in a supersensitive SNDM mode)) and a varied capacity image of each crystal phase in a plan view, of the BNO oxide layer in the first oxide layer in the multilayer capacitor according to each embodiment of the present invention.
Figure 20:
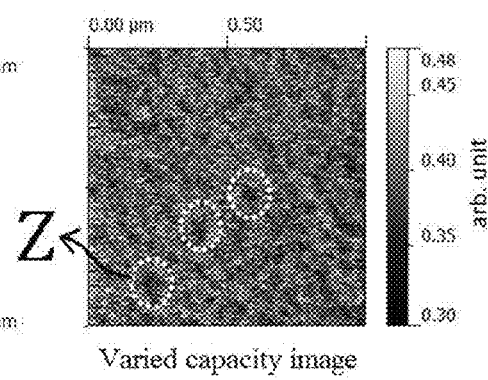
Figure 21:
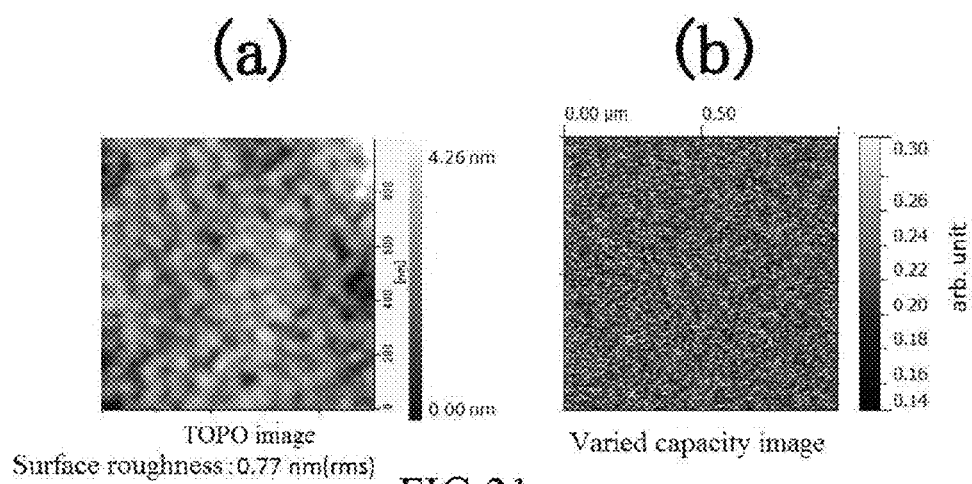
FIGS. 21(a) and 21(b) are a TOPO image (by a scanning probe microscope (in a supersensitive SNDM mode)) and a varied capacity image of each crystal phase in a plan view, of the BNO layer formed in the comparative example (the sputtering technique).
Figure 22:
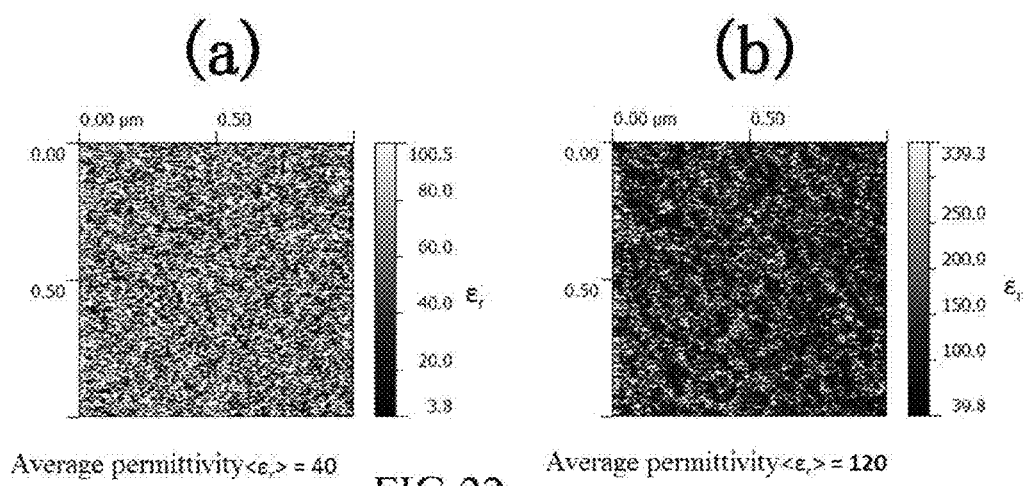
FIGS. 22(a) and 22(b) are relative permittivity images indicating distribution of calibrated relative permittivity from the varied capacity images of each crystal phase in a plan view, of the BNO layer formed in the comparative example (the sputtering technique) and the BNO layer in the first oxide layer in the multilayer capacitor according to each embodiment of the present invention, respectively.

FIGS. 20(a) and 20(b) are a TOPO image (by a scanning probe microscope (in a supersensitive SNDM mode)) and a varied capacity image of each crystal phase in a plan view, of the BNO layer in the first oxide layer 31. FIGS. 21(a) and 21(b) are a TOPO image and a varied capacity image of each crystal phase in a plan view, of the BNO layer formed in the comparative example (the sputtering technique). FIGS. 22(a) and 22(b) are relative permittivity images indicating distribution of calibrated relative permittivity from the varied capacity images of each crystal phase in a plan view of the BNO layer formed in the comparative example (the sputtering technique) and the BNO layer in the first oxide layer 31, respectively.

The TOPO images and the varied capacity images were obtained in the supersensitive SNDM mode by the scanning probe microscope (manufactured by SII Nanotechnology Inc.). The relative permittivity images indicating distribution of relative permittivity in FIGS. 22(a) and 22(b) are obtained by converting the varied capacity images in FIGS. 20(b) and 21(b) through formation of calibrated curves.

As indicated in FIGS. 20(a) to 22(b), the BNO layers mentioned above do not have large differences in surface roughness, while the BNO layer in the first oxide layer 31 was found to have a relative permittivity (Er) value much higher than a relative permittivity value of the BNO layer according to the comparative example. The TOPO image and the varied capacity image of the BNO layer in the first oxide layer 31 obviously have more significant tone distribution in comparison to those in the comparative example. It was found, by comparison with the uniform surface state of the BNO layer formed in accordance with the sputtering technique, that the BNO layer in the first oxide layer 31 includes various crystal phases.

Found through further detailed analysis was that the BNO layer in the first oxide layer 31 includes a crystal phase of the pyrochlore crystal structure having relative permittivity much higher than that of any other crystal phase, a crystal phase of the $\beta$-$BiNbO_4$ crystal structure indicated in a region Z (darker region) in FIG. 20(b), and an amorphous phase. As shown in FIGS. 20(a), 20(b), 22(a), and 22(b), the pyrochlore structure was found in the BNO layer in the first oxide layer 31 in a plan view.

The inventors of this application have reached the conclusion, through analysis and study, that, in view of that the known crystal phase of the pyrochlore crystal structure possibly formed by inclusion of "zinc" has a comparatively high relative permittivity value, provision of the crystal phase of the pyrochlore crystal structure achieves exertion of high relative permittivity. Accordingly, even if the oxide layer includes a crystal phase other than the crystal phase of the pyrochlore crystal structure and the entire oxide layer has not very high relative permittivity, the oxide layer consisting of bismuth (Bi) and niobium (Nb) and having the crystal phase of the pyrochlore crystal structure thus improves electrical properties of various solid-state electronic devices. It is noted that this interesting specific feature achieves the dielectric properties that have never been obtained.

As described above, the fine crystal phases of the pyrochlore crystal structure are distributed in the oxide layer according to each of the embodiments. The oxide layer was thus found to have relative permittivity extraordinarily higher as a BNO layer than that of a conventional oxide layer.

The present embodiment again exemplifies the multilayer capacitor 100 or the multilayer capacitor 200 according to an aspect. Application examples of the stacked dielectric layer described above are not limited to such a multilayer capacitor. Dielectric multilayer oxide, which is formed by stacking first oxide that has relatively high permittivity but relatively large leakage current and second oxide that has relatively low permittivity, quite a small leakage current, and excellent surface flatness, configures a dielectric substance expected to exert the advantages of the second oxide for the leakage current value and the flatness and exert the advantages of the first oxide for the permittivity. According to a different preferred aspect, the multilayer oxide of the excellent properties is applicable to various solid-state electronic devices (e.g. a semiconductor device or a microscopic electromechanical system).

According to a possible different preferred aspect, in view of exertion of the various properties mentioned above, the multilayer oxide is applicable to other various solid-state electronic devices (e.g. a semiconductor device or a microscopic electromechanical system) not according to the present embodiment, each of which partially has a multilayer structure of the single electrode layer and the single dielectric layer according to the present embodiment.

Other Embodiments

Figure 23:
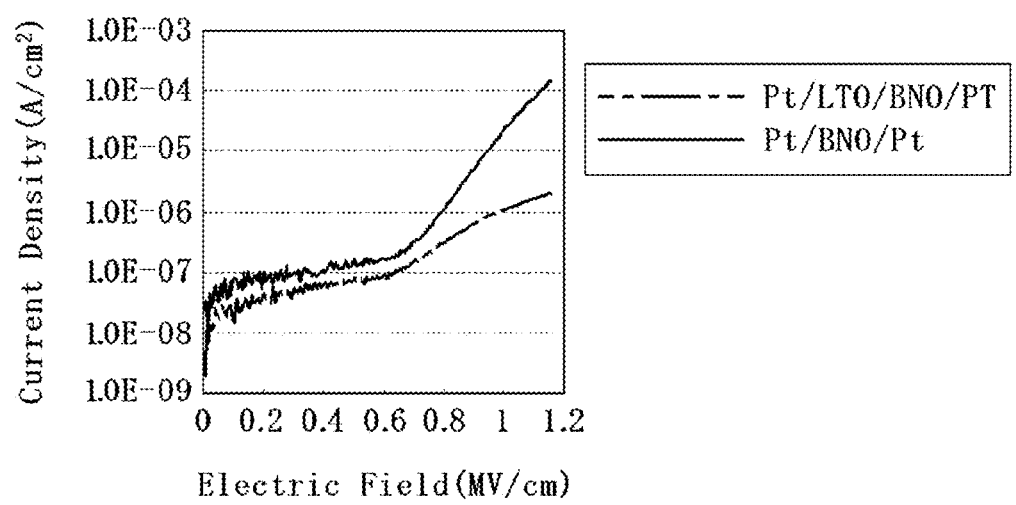
FIG. 23 is a comparative graph between a leakage current value of the first oxide layer by itself and a leakage current value of multilayer oxide including first and second oxide layers under a certain condition.

As described above, the first oxide layer 31 has the amorphous form including the fine crystal phase so as to have generally high permittivity but may have a leakage current value exceeding the applicable range to a multilayer capacitor. A typical example will be described below. FIG. 23 is a comparative graph between a leakage current value of the first oxide layer by itself and a leakage current value of multilayer oxide including a first oxide layer and a second oxide layer (LTO layer) under a certain condition. Specifically, variation in leakage current value due to variation in field intensity was checked on the first oxide layer by itself interposed between platinum (Pt) electrodes, as well as on the multilayer oxide of the first oxide layer and the second oxide layer (LTO layer) interposed between platinum (Pt) electrodes. As indicated in FIG. 23, regardless of the level of field intensity, the first oxide layer by itself was found to be larger in leakage current value than the multilayer oxide of the first oxide layer and the second oxide layer (LTO layer). It was also found that the difference in leakage current value tends to increase as the field intensity increases. The multilayer oxide of the first oxide layer and the second oxide layer according to each of the above embodiments is found to be disclosed as a quite effective example in view of reduction in leakage current value.

The dielectric layer according to each of the above embodiments is appropriate for various solid-state electronic devices configured to control large current with low drive voltage. As described above, the dielectric layer according to each of the above embodiments is applicable to a large number of solid-state electronic devices including the dielectric layer, in addition to the mainly exemplified capacitor. The dielectric layer according to each of the embodiments is applicable to a metal oxide semiconductor junction field effect transistor (MOSFET), a semiconductor device such as a nonvolatile memory, a micro total analysis system (TAS), a device of a microscopic electromechanical system represented by a microelectromechanical system (MEMS) such as a micro chemical chip or a DNA chip, or a nanoelectromechanical system (NEMS).

Formation of each layer according to the solution technique and the patterning technique by the imprinting are described in the above embodiments. The patterning method is not particularly limited in these embodiments. For example, a known green sheet method or a known printing method can be adopted in these embodiments.

The $SiO_2$/Si substrate is adopted as a base material in the above embodiments, while the base material in the embodiments is not limited thereto. For example, the embodiments can adopt any one of various base materials including an insulating substrate other than the $Sio_2$/Si substrate (e.g. highly heat resistant glass, an alumina ($Al_3O_2$) substrate, an STO (SrTiO) substrate, or an insulating substrate obtained by forming an STO (SrTiO) layer on a surface of an Si substrate with an $Sio_2$ layer and a Ti layer being interposed therebetween), and a semiconductor substrate (e.g. an Si substrate, an SiC substrate, or a Ge substrate).

The above embodiments adopt an oxide layer represented by the LTO layer as an electrode layer. Such an oxide layer can be replaced with a platinum (Pt) layer. A platinum layer 220 can be formed on an $SiO_2$/Si substrate 10 or the like in accordance with the known sputtering technique. A TiOx film (not shown) of about 10 nm thick is formed on the $SiO_2$ in the present embodiment, in order to enhance adhesion between the platinum (Pt) layer 220 and the $SiO_2$/Si substrate serving as a base material.

For appropriate exertion of the effects of the above embodiments, the first precursor solution preferably includes a mixed solvent of two alcohols selected from the group consisting of ethanol, propanol, butanol, 2-methoxyethanol, 2-ethoxyethanol, and 2-butoxyethanol. The second precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid. A channel precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid.

For appropriate exertion of the effects of the above embodiments, the electrode layer precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid.

At least some of the effects of the above embodiments can be exerted in these embodiments if the main baking according to the solution technique is performed at a heating temperature in the range from 450° C. or more to 700° C. or less for forming the first oxide. At least some of the effects of the above embodiments can be exerted if the main baking according to the solution technique is performed at a heating temperature in the range from 250° C. or more to 700° C. or less for forming the second oxide. At least some of the effects of the above embodiments can be exerted if the main baking according to the solution technique is performed at a heating temperature in the range from 250° C. or more to 700° C. or less for forming channel oxide.

Furthermore, at least some of the effects of the above embodiments can be exerted in these embodiments if the main baking according to the solution technique is performed at a heating temperature in the range from 500° C. or more to 900° C. or less for forming the electrode oxide layer.

The above embodiments each include the "imprinting step" of performing the imprinting during formation of each oxide layer. Pressure in this imprinting step is not limited to typically exemplified 5 MPa. As already described in several examples, at least some of the effects of the above embodiments can be exerted if the pressure in the imprinting step is in the range from 1 MPa or more to 20 MPa or less.

The above embodiments each include imprinting each precursor layer with high plastic deformability. Accordingly, even if the imprinting is performed with such a low pressure in the range from 1 MPa or more to 20 MPa or less, each precursor layer is deformed so as to follow the shape of the surface of the mold. It is thus possible to highly accurately form a desired imprinted structure. The pressure is set in such a low range from 1 MPa or more to 20 MPa or less, so that the mold is less likely to be damaged during the imprinting and increase in area can be also achieved advantageously.

The pressure is set within the range "from 1 MPa or more to 20 MPa or less" for the following reasons. If the pressure is less than 1 MPa, each precursor layer may not be imprinted with such a low pressure. If the pressure is as large as 20 MPa, the precursor layer can be imprinted sufficiently and no more pressure needs to be applied thereto. In view of the above, the imprinting is more preferably performed with a pressure in the range from 1 MPa or more to 20 MPa or less in the imprinting step according to each of the embodiments.

The preliminary baking for formation of each oxide layer in the above embodiments is performed most preferably at a preliminary baking temperature in the range from 100° C. or more to 250° C. or less. This is because the solvent in each precursor layer can be evaporated more reliably. Particularly if imprinting is performed subsequently, the preliminary baking in the above temperature range can cause a preferred gel state for exerting properties that enable future plastic deformation (possibly a state where organic chains remain before pyrolysis).

According to a different preferred aspect, the imprinting in the imprinting step according to the above embodiments is performed using a mold (typically the electrode layer mold M1 and the dielectric layer mold M2) preliminarily heated at a temperature in the range from 80° C. or more to 300° C. or less.

The preferred mold temperature is set in the range from 80° C. or more to 300° C. or less for the following reasons. If the mold temperature is less than 80° C., decrease in temperature of each precursor layer deteriorates plastic deformability of the precursor layer. If the mold temperature exceeds 300° C., excessive solidification of each precursor layer deteriorates plastic deformability of the precursor layer. In view of the above, the imprinting is more preferably performed using a mold heated at a temperature in the range from 100° C. or more to 250° C. or less in the imprinting step.

In the imprinting step, preferably, a mold separation process is preliminarily performed on the surface of each precursor layer to be in contact with an imprinting surface and/or on the imprinting surface of the mold, and the precursor layer is then imprinted. Such a process can decrease frictional force between each precursor layer and the mold. The precursor layer can be imprinted with higher accuracy in this case. Examples of a mold separation agent applicable in the mold separation process include surface active agents (e.g. a fluorochemical surface active agent, a silicone surface active agent, and a non-ionic surface active agent), and diamond-like carbon containing fluorine.

According to a more preferred aspect, the step of entirely etching each precursor layer is performed between the step of imprinting the precursor layer and the main baking step in the embodiments, under the condition of removing the precursor layer in the thinnest region of the imprinted precursor layer (e.g. the electrode layer precursor layer). This is because the unnecessary region can be removed more easily in comparison to the case of etching each precursor layer after the main baking. Entire etching is preferably performed before the main baking rather than after the main baking.

As described above, the above embodiments have been disclosed not for limiting the present invention but for describing these embodiments. Furthermore, modification examples made within the scope of the present invention, inclusive of other combinations of the embodiments, will be also included in the scope of the patent claims.

The invention claimed is:

1. A dielectric layer made of
multilayer oxide including a first oxide layer made of oxide consisting of bismuth (Bi) and niobium (Nb) (possibly including inevitable impurities), having atomic composition ratio of the niobium (Nb) to the bismuth (Bi) is 0.33 or more and 3 or less when the atomic composition of the bismuth (Bi) is taken as 1, and a second oxide layer made of oxide of one type (possibly including inevitable impurities) selected from the group of oxide consisting of lanthanum (La) and tantalum (Ta) having atomic composition ratio of the Tantalum (Ta) to the lanthanum (La) is 0.11 or more and 9 or less when the atomic composition of the lanthanum (La) is taken as 1, oxide consisting of lanthanum (La) and zirconium (Zr), and oxide consisting of strontium (Sr) and tantalum (Ta).

2. The dielectric layer according to claim 1, wherein oxide consisting of bismuth (Bi) and niobium (Nb) in the first oxide layer includes a crystal phase of a pyrochlore crystal structure.

3. The dielectric layer according to claim 1, wherein the first oxide layer includes a crystal phase and an amorphous phase.

4. The dielectric layer according to claim 1, wherein the second oxide layer includes a substantially amorphous phase.

5. A solid-state electronic device comprising:
the dielectric layer according to claim 1.

6. The solid-state electronic device according to claim 5, partially having
a structure including a single electrode layer and the single dielectric layer being stacked.

7. The solid-state electronic device according to claim 6, wherein
the electrode layer is made of electrode layer oxide of one type selected from the group of oxide consisting of lanthanum (La) and nickel (Ni), oxide consisting of antimony (Sb) and tin (Sn), and oxide consisting of indium (In) and tin (Sn) (possibly including inevitable impurities).

8. The solid-state electronic device according to claim 5, wherein
the solid-state electronic device is a capacitor.

9. A method of manufacturing a dielectric layer, the method comprising:

a first oxide layer forming step of heating in an atmosphere containing oxygen a first precursor layer obtained from a first precursor solution as a start material, of a precursor solution including a precursor containing bismuth (Bi) and a precursor containing niobium (Nb) as solutes, and forming a first oxide layer (possibly including inevitable impurities) consisting of the bismuth (Bi) and the niobium (Nb) having atomic composition ratio of the niobium (Nb) to the bismuth (Bi) is 0.33 or more and 3 or less when the atomic composition of the bismuth (Bi) is taken as 1; and a second oxide layer forming step of heating in an atmosphere containing oxygen a second precursor layer obtained from a second precursor solution as a start material, selected from the group of a precursor solution including a precursor containing lanthanum (La) and a precursor containing tantalum (Ta) as solutes, a precursor solution including a precursor containing lanthanum (La) and a precursor containing zirconium (Zr) as solutes, and a precursor solution including a precursor containing strontium (Sr) and a precursor containing tantalum (Ta) as solutes, and forming above or below the first oxide layer a second oxide layer (possibly including inevitable impurities) consisting of the lanthanum (La) and the tantalum (Ta) having atomic composition ratio of the Tantalum (Ta) to the lanthanum (La) is 0.11 or more and 9 or less when the atomic composition of the lanthanum (La) is taken as 1, consisting of the lanthanum (La) and the zirconium (Zr), or consisting of the strontium (Sr) and the tantalum (Ta).

10. The method of manufacturing the dielectric layer according to claim 9, wherein
the first oxide layer is formed by heating at a heating temperature in a range from 450° C. or more to 700° C. or less, and
the second oxide layer is formed by heating at a heating temperature in a range from 250° C. or more to 700° C. or less.

11. The method of manufacturing the dielectric layer according to claim 10, wherein
oxide consisting of bismuth (Bi) and niobium (Nb) in the first oxide layer includes a crystal phase of a pyrocholore crystal structure.

12. The method of manufacturing the dielectric layer according to claim 10, wherein
the first oxide layer includes a crystal phase and an amorphous phase.

13. The method of manufacturing the dielectric layer according to claim 9, wherein
oxide consisting of bismuth (Bi) and niobium (Nb) in the first oxide layer includes a crystal phase of a pyrchlore crystal structure.

14. The method of manufacturing the dielectric layer according to claim 13, wherein
the first oxide layer includes a crystal phase and an amorphous phase.

15. The method of manufacturing the dielectric layer according to claim 9, wherein
the first oxide layer includes a crystal phase and an amorphous phase.

16. The method of manufacturing the dielectric layer according to claim 9, wherein the second oxide layer includes a substantially amorphous phase.

17. A method of manufacturing a solid-state electronic device, the method comprising:

a step of manufacturing the dielectric layer according to claim 9.

18. The method of manufacturing the solid-state electronic device according to claim 17, wherein
a first oxide layer forming step and a second oxide layer forming step
are executed between a first electrode layer forming step of forming a first electrode layer and a second electrode layer forming step of forming a second electrode layer, the first oxide layer and the second oxide layer being interposed between the first electrode layer and the second electrode layer, and
the first electrode layer forming step, the first oxide layer forming step, the second oxide layer forming step, and the second electrode layer forming step are each executed once.

19. The method of manufacturing the solid-state electronic device according to claim 18, wherein
at least one of the first electrode layer forming step and the second electrode layer forming step includes
heating in an atmosphere containing oxygen an electrode layer precursor layer obtained from an electrode layer precursor solution as a start material, of a precursor solution including a precursor containing lanthanum (La) and a precursor containing nickel (Ni) as solutes, a precursor solution including a precursor containing antimony (Sb) and a precursor containing tin (Sn) as solutes, or a precursor solution including a precursor containing indium (In) and a precursor containing tin (Sn) as solutes, and forming electrode layer oxide (possibly including inevitable impurities) as oxide consisting of the lanthanum (La) and the nickel (Ni), oxide consisting of the antimony (Sb) and the tin (Sn), or oxide consisting of the indium (In) and the tin (Sn).

20. The method of manufacturing the solid-state electronic device according to claim 19, wherein
at least one of the first electrode layer forming step and the second electrode layer forming step
further includes an imprinting step of imprinting the electrode layer precursor layer obtained from the electrode layer precursor solution as a start material heated at a temperature in a range from 80° C. or more to 300° C. or less in an atmosphere containing oxygen, before forming the electrode layer oxide, and forming an imprinted structure on the electrode layer precursor layer.

21. The method of manufacturing the solid-state electronic device according to claim 18, wherein
the electrode layer oxide is formed by heating at a heating temperature in a range from 500° C. or more to 900° C. or less.

22. The method of manufacturing the solid-state electronic device according to claim 17, wherein at least one of the first oxide layer forming step and the second oxide layer forming step
further includes an imprinting step of imprinting a first precursor layer obtained from the first precursor solution as a start material of a second precursor layer obtained from the second precursor solution as a start material, being heated at a temperature in a range from 80° C. or more to 300° C. or less in an atmosphere containing oxygen, before forming the first oxide layer or the second oxide layer, and forming an imprinted structure on the first precursor layer or the second precursor layer.

23. The method of manufacturing the solid-state electronic device according to claim 22, wherein the imprinting is performed with a pressure in a range from 1 MPa or more to 20 MPa or less in the imprinting step.

24. The method of manufacturing the solid-state electronic device according to claim 22, wherein
the imprinting is performed using a mold that is preliminarily heated at a temperature in a range from 80° C. or more to 300° C. or less in the imprinting step.

25. The method of manufacturing the solid-state electronic device according to claim 17, wherein
the solid-state electronic device is a capacitor.

* * * * *